(12) United States Patent
Perisetty

(10) Patent No.: US 7,514,953 B2
(45) Date of Patent: Apr. 7, 2009

(54) ADJUSTABLE TRANSISTOR BODY BIAS GENERATION CIRCUITRY WITH LATCH-UP PREVENTION

(75) Inventor: Srinivas Perisetty, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/959,949

(22) Filed: Dec. 19, 2007

(65) Prior Publication Data
US 2008/0094100 A1 Apr. 24, 2008

Related U.S. Application Data

(63) Continuation of application No. 11/369,548, filed on Mar. 6, 2006, now Pat. No. 7,330,049.

(51) Int. Cl.
*H03K 17/16* (2006.01)
(52) U.S. Cl. .............................. 326/27; 326/81; 327/534
(58) Field of Classification Search ............. 326/37–41, 326/80–87; 327/534, 537
See application file for complete search history.

(56) References Cited

U.S. PATENT DOCUMENTS

| | | | |
|---|---|---|---|
| 5,341,034 A | 8/1994 | Matthews | |
| 5,422,591 A | 6/1995 | Rastegar et al. | |
| 5,600,264 A | 2/1997 | Duong et al. | |
| 5,610,533 A | 3/1997 | Arimoto et al. | |
| 5,689,144 A | 11/1997 | Williams | |
| 5,703,522 A | 12/1997 | Arimoto et al. | |
| 5,744,996 A | 4/1998 | Kotzle et al. | |
| 5,781,062 A | 7/1998 | Mashiko et al. | |
| 5,841,694 A | 11/1998 | Wong | |
| 5,852,552 A | 12/1998 | Kwon | |
| 5,854,561 A | 12/1998 | Arimoto et al. | |
| 5,905,402 A | 5/1999 | Kim et al. | |

(Continued)

FOREIGN PATENT DOCUMENTS

EP 0 732 796 A2 9/1996

OTHER PUBLICATIONS

U.S. Appl. No. 11/369,664, filed Mar. 6, 2006, Perisetty.
U.S. Appl. No. 11/369,654, filed Mar. 6, 2006, Perisetty.
U.S. Appl. No. 11/420,736, filed May 27, 2006.
U.S. Appl. No. 11/420,737, filed May 27, 2006.
"Challenges For Low-Power And High-Performance Chips", IEEE Design & Test Of Computers, Jul.-Sep. 1998, pp. 119-124.

(Continued)

*Primary Examiner*—Don P Le
(74) *Attorney, Agent, or Firm*—Treyz Law Group; G. Victor Treyz

(57) ABSTRACT

An integrated circuit is provided with body bias generation circuitry. The body bias generation circuitry generates a body bias signal that is provided to transistors on a body bias path. The body bias generation circuitry contains an active latch-up prevention circuit that clamps the body bias path at a safe voltage when potential latch-up conditions are detected. The level of body bias signal that is generated by the body bias circuitry is adjustable. The body bias generation circuitry regulates the body bias voltage on the body bias path using a p-channel control transistor. An isolation transistor is coupled between the p-channel control transistor and the body bias path. During potential latch-up conditions, the isolation transistor is turned off to isolate the body bias path from ground. Control circuitry adjusts a body bias voltage that is applied to body terminals in the p-channel control transistor and isolation transistor.

20 Claims, 11 Drawing Sheets

U.S. PATENT DOCUMENTS

| | | | |
|---|---|---|---|
| 5,942,784 | A | 8/1999 | Harima et al. |
| 6,157,691 | A | 12/2000 | Wei |
| 6,232,793 | B1 | 5/2001 | Arimoto et al. |
| 6,271,713 | B1 | 8/2001 | Krishnamurthy |
| 6,292,639 | B1 | 9/2001 | Inoue et al. |
| 6,343,044 | B1 | 1/2002 | Hsu et al. |
| 6,351,176 | B1 | 2/2002 | Houston |
| 6,366,482 | B1 | 4/2002 | Jeong |
| 6,373,281 | B1 | 4/2002 | Chuang et al. |
| 6,429,726 | B1 | 8/2002 | Bruneau et al. |
| 6,476,372 | B2 | 11/2002 | Merrill et al. |
| 6,484,265 | B2 | 11/2002 | Borkar et al. |
| 6,518,825 | B2 | 2/2003 | Miyazaki et al. |
| 6,525,559 | B1 | 2/2003 | Wu et al. |
| 6,535,034 | B1 | 3/2003 | Wong |
| 6,549,032 | B1 | 4/2003 | Shumarayev et al. |
| 6,559,708 | B2 | 5/2003 | Notani |
| 6,590,440 | B1 | 7/2003 | Williams et al. |
| 6,597,203 | B2 | 7/2003 | Forbes |
| 6,605,981 | B2 | 8/2003 | Bryant et al. |
| 6,614,688 | B2 | 9/2003 | Jeong et al. |
| 6,650,141 | B2 | 11/2003 | Agrawal et al. |
| 6,670,655 | B2 | 12/2003 | Lukes et al. |
| 6,731,158 | B1 | 5/2004 | Hass |
| 6,744,301 | B1 | 6/2004 | Tschanz et al. |
| 6,777,978 | B2 | 8/2004 | Hart et al. |
| 6,972,593 | B1 | 12/2005 | Wang et al. |
| 6,972,599 | B2 | 12/2005 | Forbes |
| 6,980,033 | B2 | 12/2005 | Forbes |
| 7,098,689 | B1 | 8/2006 | Tuan et al. |
| 7,112,997 | B1 | 9/2006 | Liang et al. |
| 2001/0012673 | A1 | 8/2001 | Gyu-chul |
| 2002/0005750 | A1 | 1/2002 | Kao et al. |
| 2002/0024378 | A1 | 2/2002 | Forbes et al. |
| 2002/0029352 | A1 | 3/2002 | Borkar et al. |
| 2002/0030533 | A1 | 3/2002 | De et al. |
| 2002/0031028 | A1 | 3/2002 | Forbes et al. |
| 2002/0033730 | A1 | 3/2002 | Yao et al. |
| 2002/0044076 | A1 | 4/2002 | Yao et al. |
| 2002/0079951 | A1 | 6/2002 | Borkar et al. |
| 2002/0118569 | A1 | 8/2002 | Jeong et al. |
| 2002/0140496 | A1 | 10/2002 | Keshavarzi et al. |
| 2002/0155671 | A1 | 10/2002 | Lukes et al. |
| 2002/0163377 | A1 | 11/2002 | Bruneau et al. |
| 2002/0171461 | A1 | 11/2002 | Yamazaki et al. |
| 2002/0171468 | A1 | 11/2002 | Bryant et al. |
| 2002/0179876 | A1 | 12/2002 | Pang et al. |
| 2003/0001633 | A1 | 1/2003 | Gresham |
| 2003/0001663 | A1 | 1/2003 | Zhang |
| 2003/0005378 | A1 | 1/2003 | Tschanz et al. |
| 2003/0016078 | A1 | 1/2003 | Hinterscher |
| 2003/0038668 | A1 | 2/2003 | Zhang et al. |
| 2003/0053335 | A1 | 3/2003 | Hart et al. |
| 2003/0067042 | A1 | 4/2003 | Kaatz |
| 2003/0080802 | A1 | 5/2003 | Ono et al. |
| 2003/0141929 | A1 | 7/2003 | Casper et al. |
| 2003/0151428 | A1 | 8/2003 | OuYang |
| 2003/0208611 | A1 | 11/2003 | Weber et al. |
| 2003/0209752 | A1 | 11/2003 | Cai et al. |
| 2003/0218478 | A1 | 11/2003 | Sani et al. |
| 2004/0016977 | A1 | 1/2004 | Miyazaki et al. |
| 2004/0123170 | A1 | 6/2004 | Tschanz et al. |
| 2005/0036346 | A1 | 2/2005 | Kim et al. |
| 2005/0231274 | A1 | 10/2005 | Wu |
| 2005/0258862 | A1 | 11/2005 | Rahim et al. |
| 2005/0280437 | A1 | 12/2005 | Lewis et al. |
| 2005/0280463 | A1 | 12/2005 | Chih |
| 2006/0038605 | A1 | 2/2006 | Pineda De Gyvez et al. |
| 2006/0019382 | A1 | 6/2006 | Shumarayev et al. |
| 2006/0119382 | A1 | 6/2006 | Shumarayev et al. |

OTHER PUBLICATIONS

Kawaguchi et al., "Dynamic Leakage Cut-Off Scheme For Low-Voltage SRAM's", IEEE, Symposium On VLSI Circuits Digest Of Technical Papers, 1998, pp. 140-141.

Nose et al., "Voltage Dependent Gate Capacitance And Its Impact In Estimating Power And Delay Of CMOS Digital Circuits With Low Supply Voltage", ISLPED, 2000, pp. 228-230.

Zyuban et al., "Low Power Integrated Scan-Retention Mechanism", ISLPED, Aug. 12-14, 2002, pp. 98-102.

Das et al., "Ultra Low-Leakage Power Strategies For Sub-1 V VLSI:Novel Circuit Styles And Design Methodologies For Partially Depleted Silicon-On-Insulator (PD-SOI) CMOS Technology", 16th International Conference on VLSI Design, 2003, 6 pgs.

Yeap, "Leakage Current In Low Standby Power And High Performance Devices: Trends And Challenges", ISPD, Apr. 7-10, 2002, pp. 22-27.

Huang et al., "Scalability And Biasing Strategy For CMOS With Active Well Bias", Abstract *Only, Symposium On VLSI Technology*, 2001, 1 pg.

Kawaguchi et al., "FP 12.4: A CMOS Scheme For 0.5V Supply Voltage With Pico-Ampere Standby Current", IEEE, 1998, pp. 12.4-1 to 12.4-10.

Heo et al., "Dynamic Fine-Grain Leakage Reduction Using Leakage-Biased Bitlines", 29th Annual International Symposium For Computer Architecture (ISCA-29), May 2002, 11 pgs.

Kosonocky et al., "Enhanced Multi-Threshold (MTCMOS) Circuits Using Variable Well Bias", ISLPED, Aug. 6-7, 2001. pp. 165-169.

Kim et al., "Dynamic VTH Scaling Scheme For Active Leakage Power Reduction", Design, Automation And Test In Europe Conference And Exhibition, Mar. 2002, 5 pgs.

Gayasen et al., "Reducing Leakage Energy In FPGAs Using Region-Constrained Placement", FPGA, Feb. 22-24, 2004, 8 pgs.

Chen et al., "Low-Power Technology Mapping For FPGA Architectures With Dual Supply Voltage", FPGA, Feb. 22-24, 2004, 9 pgs.

Li et al., "Low-Power FPGA Using Pre-defined Dual-Vdd/Dual-Vt Fabrics", FPGA, Feb. 22-24, 2004, 9 pgs.

Anderson et al., "Active Leakage Power Optimization For FPGAs", FPGA, Feb. 22-24, 2004, pp. 33-41.

Kosonocky et al., "Low-Power Circuits And Technology For Wireless Digital Systems", IBM J. Res. & Dev., vol. 47, No. 2/3, Mar./May 2003, pp. 283-298.

Sukurai, "Low Power Design of Digital Circuits", pp. 1-5, published before Nov. 12, 2004.

Sakurai, "Recent Topics for Realizing Low-Power, High-Speed VLSIs", 6 pgs., published before Nov. 12, 2004.

Sakurai, "Recent Topics For Realizing Low-Power, High-Speed VLSIs", Workshop on Advanced CMOS, Oct. 31, 2001, 24 pgs.

Heo et al., "Leakage-Biased Domino Circuits For Dynamic Fine-Grain Leakage Reduction", Symposium On VLSI Circuits, Jun. 2002, 4 pgs.

Tschanz et al., "Dynamic Sleep Transistor And Body Bias For Active Leakage Power Control Of Microprocessors", IEEE Journal Of Solid-State Circuits, vol. 38, No. 11, Nov. 2003, pp. 1838-1845.

Miyazaki et al., "A 1.2-GIPS/W Microprocessor Using Speed-Adaptive Threshold-Voltage CMOS With Forward Bias", IEEE Journal Of Solid-State Circuits, vol. 37, No. 2, Feb. 2002, pp. 210-217.

Tschanz et al., "Adaptive Body Bias For Reducing Impacts Of Die-To-Die And Within-Die Parameter Variations On Microprocessor Frequency And Leakage", IEEE Journal Of Solid-State Circuits, vol. 37, No. 11, Nov. 2002, pp. 1396-1402.

Kuroda et al., "Variable Supply-Voltage Scheme For Low-Power High-Speed CMOS Digital Design", IEEE Journal Of Solid-State Circuits, vol. 33, No. 3, Mar. 1998, pp. 454-462.

Inukai et al., "Variable Threshold Voltage CMOS (VTCMOS) In Series Connected Circuits", ISPLED, Aug. 6-7, 2001, 7 pgs.

Sakurai et al., "Low-Power CMOS Design Through $V_{TH}$ Control And Low-Swing Circuits", 1997, pp. 1-6.

Kawaguchi et al., "A Reduced Clock-Swing Flip-Flop (RCSFF) For 63% Clock Power Reduction", Symposium on VLSI Circuits Digest Of Technical Papers, 1997, pp. 97-98.

Kuroda et al., "A 0.9-V, 150-MHz, 10-mW, 4mm², 2-D Discrete Cosine Transform Core Processor With Variable Threshold-Voltage (VT) Scheme", IEEE Journal Of Solid-State Circuits, vol. 31, No. 11, Nov. 1996, pp. 1770-1779.

Nose et al., "Optimization Of $V_{DD}$ and $V_{Th}$ For Low-Power And High-Speed Applications", Proceedings ASP-DAC, 2000, 6 pgs.

Kawaguchi et al., "A Super Cut-Off CMOS (SCCMOS) Scheme For 0.5-V Supply Voltage With Picoampere Stand-By Current", IEEE Journal Of Solid-State Circuits, vol. 35, No. 10, Oct. 2000, pp. 1498-1501.

Nose et al., "$V_{TH}$-Hopping Scheme To Reduce Subthreshold Leakage For Low-Power Processors", IEEE Journal Of Solid-State Circuits, vol. 37, No. 3, Mar. 2002, pp. 413-419.

Nose et al., "$V_{TH}$Hopping Scheme For 82% Power Saving In Low-Voltage Processors", IEEE, 2001, 4 pgs.

Kuroda et al., "Substrate Noise Influence On Circuit Performance In Variable Threshold-Voltage Scheme", ISLPED, 1996, 6 pgs.

Kuroda et al., "A 0.9-V, 150-MHz, 10-mW, 4mm², 2-D Discrete Cosine Transform Core Processor With Variable Threshold-Voltage Scheme", IEEE International Solid-State Circuits Conference, Technical Papers, 1996, 14 pgs.

Anderson et al., "A Novel Low-Power FPGA Routing Switch", IEEE Custom Integrated Circuits Conference, 2004, 4 pgs.

Anderson et al., "Low-Power Programmable Routing Circuitry for FPGAs", 8 pgs., published before Nov. 12, 2004.

Inukai et al., "Variable Threshold Voltage CMOS in Series Connected Circuits", 29 pgs., published before Nov. 12, 2004.

Roy, "Leakage: Estimation And Circuit Design Technique for Nano-Scale Technologies", 102 pgs., published before Nov. 12, 2004.

Kuroda et al., "Overview Of Low-Power ULSI Circuit Technique", IEICE Trans. Electron., vol. E78-C, No. 4, Apr. 1995, 12 pgs.

Robenson, "Investigation Of A Dynamic Threshold Voltage Control Via Body Bulk-Biasing As A Forth Terminal On A CMOS Process Technology", University of Florida, Journal Of Undergraduate Research, http://web.clas.ufl.edu/CLAS/jur/0603/robensonpaper.html, Jun. 2003, 8 pgs.

Kobayashi et al, "Self-Adjusting Threshold-Voltage Scheme (SATS) For Low-Voltage High-Speed Operation", IEEE Custom Integrated Circuits Conference, May 1994, 5 pgs.

Burr et al, "A 200mV Self-Testing Encoder/Decoder Using Stanford Ultra-Low-Power CMOS", IEEE International Solid-State Circuits Conference, Digest Of Technical Papers, 1994, 3 pgs.

Hamada et al., "Utilizing Surplus Timing For Power Reduction", IEEE Custom Integrated Circuits Conference, 2001, pp. 89-92.

Kuroda, "Design With Multiple $V_{DD}$ Planes", ISSCC Workshop On Microprocessors, Feb. 2003, 36 pgs.

Kuroda, "CMOS Design Challenges To Power Wall", MNC, 2001, 58 pgs.

Martin et al, "Combined Dynamic Voltage Scaling And Adaptive Body Biasing For Lower Power Microprocessors Under Dynamic Workloads", ICCAD, Nov. 2002, 5 pgs.

Kuroda, "Optimization And Control For $V_{DD}$ And $V_{TH}$ For Low-Power, High-Speed CMOS Design", IEEE, 2002, 7 pgs.

Kuroda, "Low-Power, High-Speed CMOS VLSI Design", IEEE International Conference On Computer Design: VLSI In Computers And Processors, 2002, 6 pgs.

Najm, "State Dependence And Sleep States; Memory/Cache Circuits And Architectures", ICCAD, 2003, 67 pgs.

Anderson et al., "Low-Power Programmable Routing Circuitry For FPGAs", IEEE, 2004, 8 pgs.

Borkar et al., "Parameter Variations And Impact On Circuits And Microarchitecture", Circuit Research, Intel Labs, 14 pgs., published before Nov. 12, 2004.

Narendra et al., "Forward Body Bias For Microprocessors In 130-nm Technology Generation And Beyond", IEEE Journal Of Solid-States Circuits, vol. 38, No. 5, May 2003, pp. 696-701.

Augsburger et al., "Combining Dual-Supply, Dual-Threshold, And Transistor Sizing For Power Reduction", 6 pgs., published before Nov. 12, 2004.

Kuroda, "Power-Aware Electronics: Challenges And Opportunities Unit 4: Design With Multiple $V_{DD}/V_{TH}$Planes", FTFC Tutorial, May 14, 2003, 30 pgs.

Kuroda, paper in ISSCC 2002, 54 pages.

Kuroda, "Power-Aware Electronics: Challenges And Opportunities Unit 5: Variable $V_{DD}/V_{TH}$ Design Techniques", FTFC Tutorial, May 14, 2003, 38 pages.

Kuroda, "10 Tips For Low Power CMOS Design", 40th DAC Tutorial 1 "Design Techniques For Power Reduction", Jun. 2, 2003, 72 pgs.

ADJUSTABLE TRANSISTOR BODY BIAS GENERATION CIRCUITRY WITH LATCH-UP PREVENTION

This application is a continuation of patent application Ser. No. 11/369,548, filed Mar. 6, 2006, which is hereby incorporated by referenced herein in its entirety.

BACKGROUND

This invention relates to providing adjustable transistor body bias signals using body bias generation circuitry with latch-up prevention capabilities.

The performance of modern integrated circuits is often limited by power consumption considerations. Circuits with poor power efficiency place undesirable demands on system designers. Power supply capacity may need to be increased, thermal management issues may need to be addressed, and circuit designs may need to be altered to accommodate inefficient circuitry.

Integrated circuits often use complementary metal-oxide-semiconductor (CMOS) transistor technology. CMOS integrated circuits have n-channel metal-oxide-semiconductor (NMOS) and p-channel metal-oxide-semiconductor (PMOS) transistors.

NMOS and PMOS integrated circuits have four terminals—a drain, a source, a gate, and a body. The body terminal, which is sometimes referred to as the well or bulk terminal, can be biased. For example, a positive bias voltage can be applied to the n-type body of a PMOS transistor and a negative bias voltage can be applied to the p-type body of an NMOS transistor. These bias voltages increase the threshold voltages of the transistors and thereby reduce their leakage currents. Reductions in leakage current reduce power consumption.

In commonly-used CMOS integrated circuit transistor structures, doped semiconductor regions form a pair of parasitic bipolar transistors. The presence of the parasitic bipolar transistors makes the CMOS transistors susceptible to an undesirable phenomenon called latch-up. During a latch-up event, feedback paths are created in the parasitic bipolar transistors that cause the CMOS transistors to function improperly. In severe situations, latch-up can permanently damage the CMOS transistors. Latch-up problems are particularly serious in integrated circuits using body biasing.

One way to prevent latch-up in a CMOS integrated circuit is to place power-up restrictions on users of the integrated circuit. These power-up restrictions dictate the order in which various voltage supply pins on the integrated circuit can receive signals. By designing systems to strictly follow the power-up rules, designers can be assured that the integrated circuit will not exhibit latch-up.

It is not always acceptable to place power-up restrictions on a system designer. In certain applications, it is desirable to allow an integrated circuit to be removed from a system and reinserted in a system without restriction. The process of swapping an integrated circuit or a component in which an integrated circuit is used in and out of a system is sometimes referred to as hot socketing. Hot-socket compatibility is highly desirable for applications in which a device needs to be moved between systems or used intermittently, but can lead to violations of power-up restrictions.

When a device is inserted into a system, electrical connections are formed between pins on the device and pins in the system. With commonly-used connectors, it is not possible to ensure the order in which the various pins will contact each other. As a result, the order in which the voltage supply pins on the integrated circuit receive signals from the system is not known in advance and cannot be controlled. If a user happens to insert a device into a socket in a way that causes the voltage supply pins to form connections in an inappropriate order, the integrated circuit may experience latch-up.

It would therefore be desirable to provide ways in which to supply body bias signals to transistors on an integrated circuit while preventing latch-up.

SUMMARY

In accordance with the present invention, an integrated circuit such as a programmable logic device integrated circuit is provided that contains body bias generation circuitry. The integrated circuit contains metal-oxide-semiconductor transistors with body bias terminals. The body bias generation circuitry produces a body bias signal on a body bias path. The body bias path distributes the body bias signal to the body terminals.

The integrated circuit has input-output pins that receive power supply signals including a positive power supply signal, an elevated power supply signal that is larger than the positive power supply signal, and a ground power supply signal.

The body bias generation circuitry contains an adjustable voltage divider that is coupled between the body bias path and a ground power supply terminal. The adjustable voltage divider contains a chain of series-connected resistors. Associated transistors are used to define a voltage tap location in the resistor chain. The transistors are controlled by control signals provided over respective control lines. The control signals may be supplied by programmable elements. The voltage tap location defines a feedback voltage. The magnitude of the feedback voltage in relation to the body bias signal is adjusted by using the control signals to turn on and off the transistors in the adjustable voltage divider.

The feedback voltage is provided to an input of an operational amplifier. The operational amplifier compares the feedback voltage to a reference voltage and produces a corresponding output signal. The output signal from the operational amplifier is applied to the gate of a p-channel control transistor. The p-channel control transistor is coupled between the body bias path and an elevated power supply terminal. During normal operation of the integrated circuit, the output signal controls the p-channel control transistor to regulate the magnitude of the body bias signal on the body bias path. The body bias signal level is adjusted by adjusting the setting of the adjustable voltage divider.

The body bias generation circuitry has active latch-up prevention circuitry. The active latch-up prevention circuitry has a p-channel latch-up prevention transistor that is coupled between a positive power supply terminal and the body bias path. When potential latch-up conditions are detected, the active latch-up prevention circuitry turns the p-channel latch-up prevention transistor on, which clamps the body bias path at the positive power supply signal level and prevents latch-up.

A p-channel isolation transistor is connected between the p-channel control transistor and the body bias path. During potential latch-up conditions, the isolation transistor is turned off, which isolates the body bias path from the elevated power supply terminal (which is at zero volts) and allows the active latch-up prevention circuitry to operate properly. During normal operation conditions, when the potential for latch-up is not present, the isolation transistor is turned on. With the isolation transistor turned on, the drain of the p-channel control transistor is electrically connected to the body bias path through a low-resistance path, so that the body bias voltage can be regulated.

The p-channel isolation transistor and the p-channel control transistor have body terminals. Control circuitry monitors the power supply voltages for potential latch-up conditions. When potential latch-up conditions are detected, the body terminals of the isolation transistor and control transistor are provided with a positive power supply voltage to prevent latch-up. When potential latch-up conditions are not present, the body terminals of the isolation transistor and the control transistor are provided with an elevated power supply voltage.

Further features of the invention, its nature and various advantages will be more apparent from the accompanying drawings and the following detailed description.

DETAILED DESCRIPTION

The present invention relates to adjustable body bias generation for transistors on integrated circuits. The integrated circuits may be of any suitable type. With one particularly suitable arrangement, adjustable body bias generation circuitry in accordance with the invention is used on a programmable logic device integrated circuit. The adjustable body bias generation circuitry can also be used on integrated circuits such as digital signal processors, microprocessors, custom integrated circuits, or any other integrated circuit with body-biased transistors. The present invention is generally described in the context of programmable logic device integrated circuits as an example.

Programmable logic device integrated circuits can be customized using configuration data. In a typical scenario, a logic designer uses a computer-aided design (CAD) system in designing a desired logic circuit. The computer-aided design system uses information on the hardware capabilities of a programmable logic device to generate configuration data.

Programmable logic devices contain programmable elements. The programmable elements may be based on any suitable programmable technology such as fuses, antifuses, laser-programmed elements, electrically-programmed elements, non-volatile memory elements, volatile memory elements, mask-programmed elements, etc. In a typical scenario, the programmable elements are based on random-access memory (RAM) cells.

To customize programmable logic devices to implement the desired logic circuit, the configuration data produced by the computer-aided design system is loaded into the programmable elements. During operation of the programmable logic device, each programmable element provides a static output signal based on its loaded configuration data. The outputs signals from the programmable elements are applied to the gates of metal-oxide-semiconductor transistors in regions of programmable logic on the programmable logic device. This configures the programmable logic so that the programmable logic device implements the desired logic circuit.

The programmable logic and other circuitry on the programmable logic device is formed from n-channel metal-oxide-semiconductor field-effect transistors (NMOS transistors) and p-channel metal-oxide-semiconductor field-effect transistors (PMOS transistors). Integrated circuits with NMOS and PMOS transistors are referred to as complementary metal-oxide-semiconductor (CMOS) integrated circuits.

To reduce power consumption, at least some of the transistors are provided with body biases. For example, NMOS transistors may be provided a body bias voltage that is slightly lower than ground and PMOS transistors may be provided with body bias that is slightly larger than their positive power supply voltage. These body bias voltages reduce transistor leakage and thereby reduce power consumption.

Figure 1:
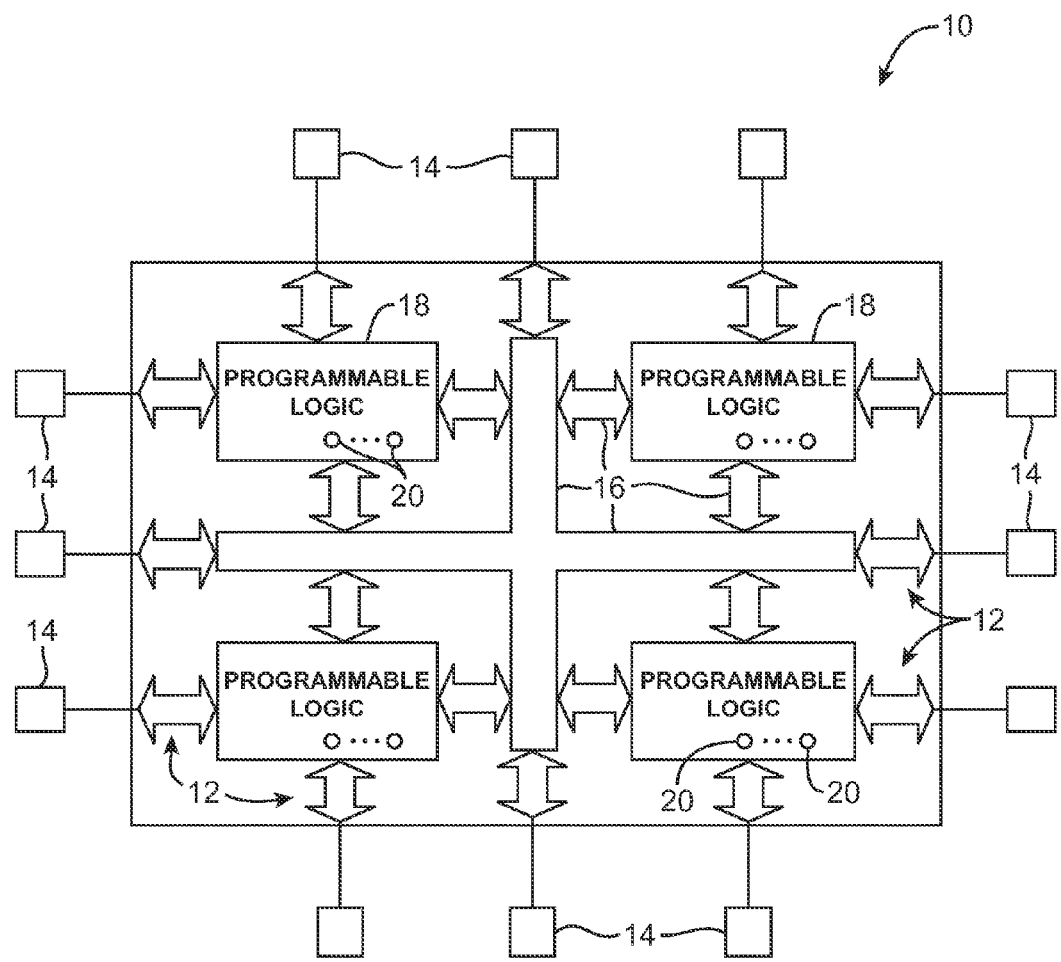
FIG. 1 is a diagram of an illustrative programmable logic device integrated circuit in accordance with the present invention.

An illustrative programmable logic device 10 in accordance with the present invention is shown in FIG. 1. Programmable logic device 10 is preferably hot socket compatible. Programmable logic device 10 has input-output circuitry 12 for driving signals off of device 10 and for receiving signals from other devices via input-output pins 14. Interconnection resources 16 such as global and local vertical and horizontal conductive lines and busses are used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function. The programmable interconnects associated with interconnection resources 16 may be considered to be a part of programmable logic 18.

The programmable elements 20 in logic 18 may be loaded from any suitable source. In a typical arrangement, the programmable elements are loaded from an external erasable-programmable read-only memory and control chip called a configuration device via pins 14 and input-output circuitry 12.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

The primary processing circuitry of integrated circuits such as integrated circuit 10 of FIG. 1 is located in the central region of the device. Input-output circuitry 12 is typically located around the periphery of the integrated circuit. The central region of the device is sometimes referred to as the core of the device and the circuitry in that region is sometimes referred to as core circuitry or core logic. Many integrated circuits use multi-level power supply schemes in which core circuitry is powered using a relatively low power supply level and input-output predriver circuits and other peripheral components are powered using one or more elevated supply levels. The core logic power supply level is sometimes referred to as Vcc-core or Vcc. One of the elevated power supply levels that may be used for powering peripheral circuitry is sometimes referred to as Vccpd. Other power supply levels may also be used. The voltage Vss is generally referred to as ground.

Any suitable number of different power supply levels may be used to power device 10. An integrated circuit 10 that is powered using an elevated power supply level Vccpd of 2.5 volts, a positive core logic power supply voltage of 1.1 volts, and a ground voltage Vss of 0 volts is described herein as an example. Power supply voltage Vccpd is preferably obtained from a preexisting power supply line to avoid unnecessarily increasing the complexity of the programmable logic device 10. Power supply voltage Vccpd may, as an example, be the same power supply voltage that is used to power driver circuitry in input-output circuits 12 of FIG. 1. This power supply configuration is merely illustrative. Other suitable power supply voltages may be used to power the integrated circuit 10 if desired.

The transistors on device 10 have four terminals—a source, a drain, a gate, and a body. The body terminal, which is also sometimes referred to as a well terminal or a bulk terminal, can be biased to reduce power consumption. In n-channel metal-oxide-semiconductor transistors, the body terminal voltage can be lowered somewhat relative to ground (Vss). In p-channel metal-oxide-semiconductor transistors, the body terminal voltage can be elevated slightly with respect to the positive power supply voltage (Vcc). For example, if Vcc is 1.1 volts, the body terminal of a p-channel metal-oxide-semiconductor transistor can be biased at a positive voltage having a magnitude in the range of about 1.1 to 2.5 volts.

Figure 2:
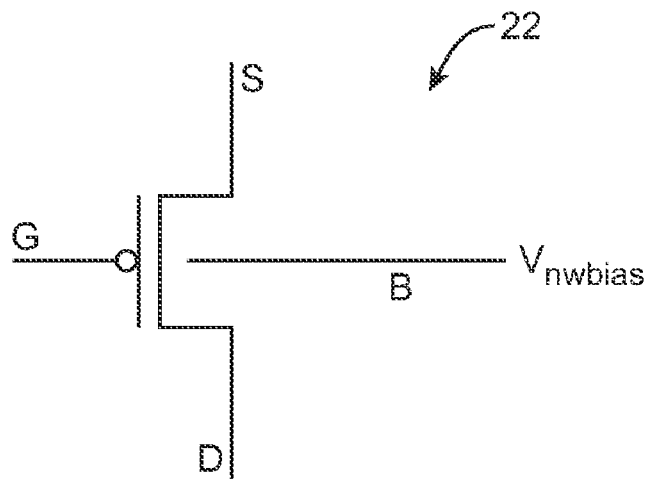
FIG. 2 is a schematic diagram of a body-biased p-channel metal-oxide-semiconductor transistor in accordance with the present invention.
Figure 3:
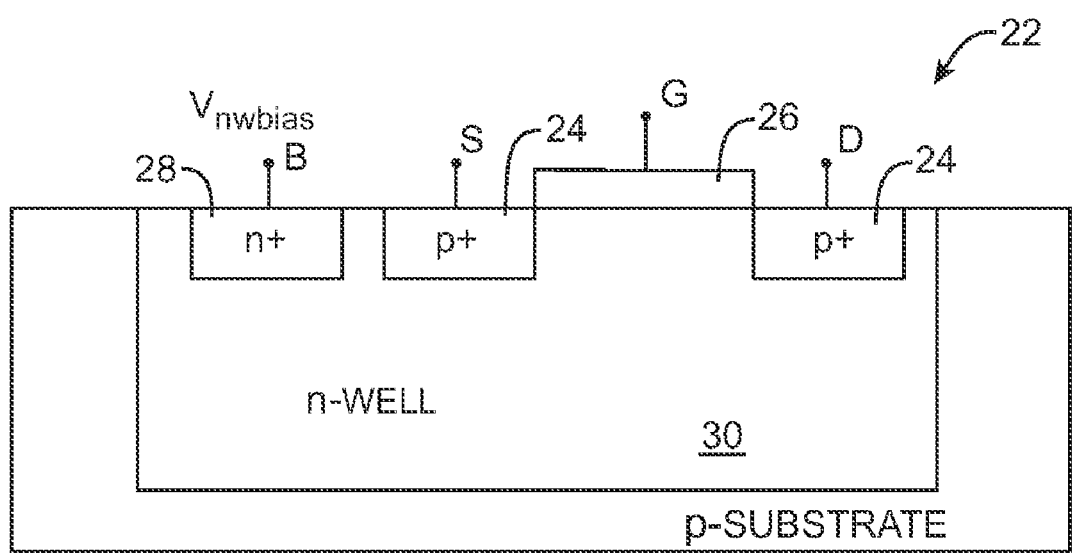
FIG. 3 is a cross-sectional view of a body-biased p-channel metal-oxide-semiconductor transistor in accordance with the present invention.

A schematic diagram of an illustrative p-channel metal-oxide-semiconductor transistor 22 is shown in FIG. 2. The source of transistor 22 is labeled S, the drain is labeled D, the gate is labeled G, and the body is labeled B. As shown in FIG. 2, a body bias voltage Vnwbias is applied to body terminal B. A cross-sectional diagram of the p-channel transistor 22 of FIG. 2 is shown in FIG. 3. Source S and drain D are formed using implant regions 24. Gate structure 26 is formed from a thin layer of insulator such as silicon oxide and a gate conductor such as silicided polysilicon. Body terminal B uses implant region 28 to form an ohmic contact with n-type body region 30.

Integrated circuits in accordance with the present invention may be provided with on-die n-channel metal-oxide-semiconductor (NMOS) and p-channel metal-oxide-semiconductor (PMOS) body bias circuitry. The body bias circuitry may be adjusted to provide different levels of body bias. In programmable logic device integrated circuits, adjustable body bias generators are particularly advantageous, because they allow a logic designer to customize the body bias levels to be used in the logic designer's custom logic circuit.

In accordance with the present invention, adjustable PMOS body bias circuitry is provided that can generate stable and accurate positive bias voltages having magnitudes greater than Vcc. In an illustrative embodiment, the adjustable PMOS body bias circuitry is powered using a positive power supply voltage Vccpd (e.g., 2.5 volts) that is elevated with respect to Vcc (e.g., 1.1 volts). The adjustable PMOS body bias circuitry may use a PMOS control transistor in its voltage regulator circuit, which allows the adjustable body bias generation circuitry to generate PMOS transistor body bias voltages in the range of 1.1 volts to 2.5 volts.

The body bias voltages that are generated by the PMOS body bias circuitry can be used to bias p-channel transistors such as transistor 22 of FIGS. 2 and 3 to reduce power consumption. In general, any suitable number of transistors may be provided with a body bias. For example, some or all of the p-channel transistors on the device 10 may be provided with a body bias and some or all of the n-channel transistors may be provided with a body bias. An advantage to providing extensive body biasing is that the power consumption of the device 10 will be minimized. An advantage of using body biasing selectively is that performance can be optimized. For example, body biasing to reduce power consumption can be avoided (or reduced) in critical signal paths where maximum performance is desired.

Decisions regarding which circuitry on the device 10 is to be provided with body biasing and the amount of biasing to use may be made by the logic designer or CAD tool during the design process. Based on these decisions, the CAD tool can generate configuration data for adjusting the adjustable body bias circuitry. Once loaded into the programmable logic device 10, the configuration data can be used to selectively turn biasing on and off for various portions of the device 10 and to adjust the amount of biasing that is used for various portions of the device 10 (e.g., to maximize performance in some portions of the device 10 and to maximize power consumption savings in other portions of the device 10). In general, any suitable number of different body bias voltages may be produced on a given programmable logic device.

Figure 4:
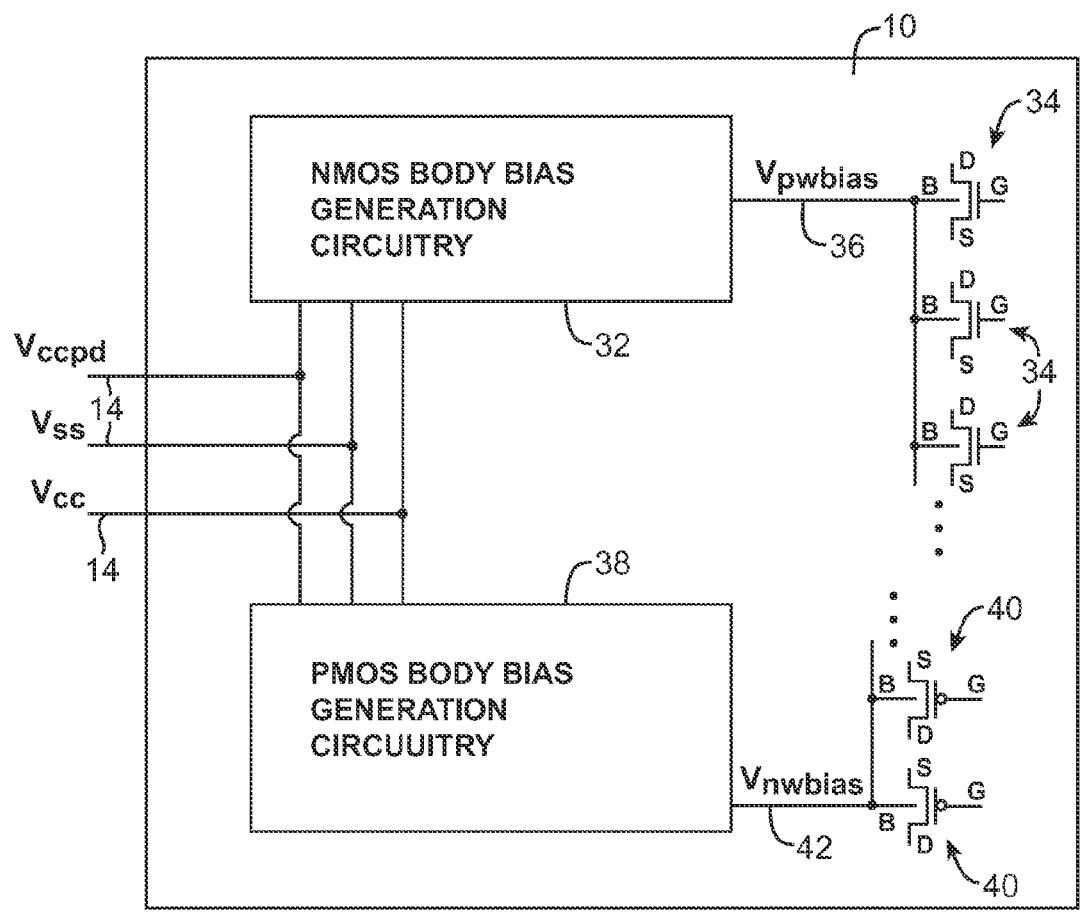
FIG. 4 is a schematic diagram of an integrated circuit with transistors that receive body biases from on-die body bias generation circuitry in accordance with the present invention.

A schematic diagram of an illustrative integrated circuit 10 using PMOS and NMOS body biasing circuitry is shown in FIG. 4. Pins 14 are used to receive power supply voltages Vcc, Vss, and Vccpd. NMOS body bias generator 32 generates body bias voltage Vpwbias. The body bias signal Vpwbias is distributed to the p-type bodies of NMOS transistors 34 via body bias paths such as path 36. PMOS body bias generator 38 generates body bias voltage Vnwbias. The body bias signal Vnwbias is distributed to the n-type bodies of PMOS transistors 40 via body bias paths such as path 42. In the example of FIG. 4, a single value Vpwbias and a single value of Vnwbias are generated. This is merely illustrative. For example, two PMOS body bias voltages (Vnwbias1 and Vnwbias2) may be generated for two associated groups of PMOS transistors 40 or more than two PMOS body bias voltages may be generated.

The control signals that are used to adjust the body bias signals such as Vnwbias may be obtained from any suitable source. With one suitable arrangement, the static output signals from some of the programmable elements 20 that have been loaded with configuration data are used as control signals for adjusting the body bias generation circuitry 32 and 38. With another suitable arrangement, dynamic signals generated on the programmable logic device 10 (e.g., by programmable logic 18 or hardwired logic) may be used as control signals. Control signals may also be supplied from external sources using one or more pins 14.

Any suitable power supply arrangement may be used to power on-chip generators such as generators 32 and 38. In the example of FIG. 4, PMOS body bias generation circuitry 38 and NMOS power body bias generation circuitry 32 are powered using core power supply voltage Vcc, elevated power supply voltage Vccpd, and ground voltage Vss. In general, internal (on-die) body bias generation schemes attempt to minimize use of power supply pins and therefore are preferably operated using power supply voltages that would otherwise be made available on integrated circuit 10. If desired, however, one or more additional positive or negative power supply voltages may be used.

The states of the body bias signals Vpwbias and Vnwbias are dependent on the states of the power supply voltages at pins 14. Integrated circuit 10 is hot-socket compatible, so a user of a device in which integrated circuit 10 is being used is typically free to connect or disconnect the device 10 from its sources of power. A user may, for example, pull a device containing integrated circuit 10 from one socket and insert it into another socket or integrated circuit 10 may be used in a system without power-up restrictions. Device 10 may also be used in a system board without power-up restrictions. As the power supply pins 14 that supply power signals Vcc, Vss, and Vccpd make contact or receive power from a system board, signals Vcc, Vss, and Vccpd are established and made valid in a particular order.

For example, if the user inserts the device in one way, the signal Vcc may be made valid first (i.e., when a conductor in a socket that is carrying Vcc makes an electrical connection to the Vcc pin on integrated circuit 10). If the user inserts the same device in a slightly different way, the signal Vccpd may be made valid first (i.e., when a conductor in the socket that is carrying a valid Vccpd signal makes an electrical connection to the Vccpd pin on integrated circuit 10). In certain situations, the sequence of power supply signals that is applied to the integrated circuit 10 has the potential to cause a latch-up condition. When this particular power-up sequence occurs, the integrated circuit 10 has the potential to become damaged or inoperable.

Figure 5:
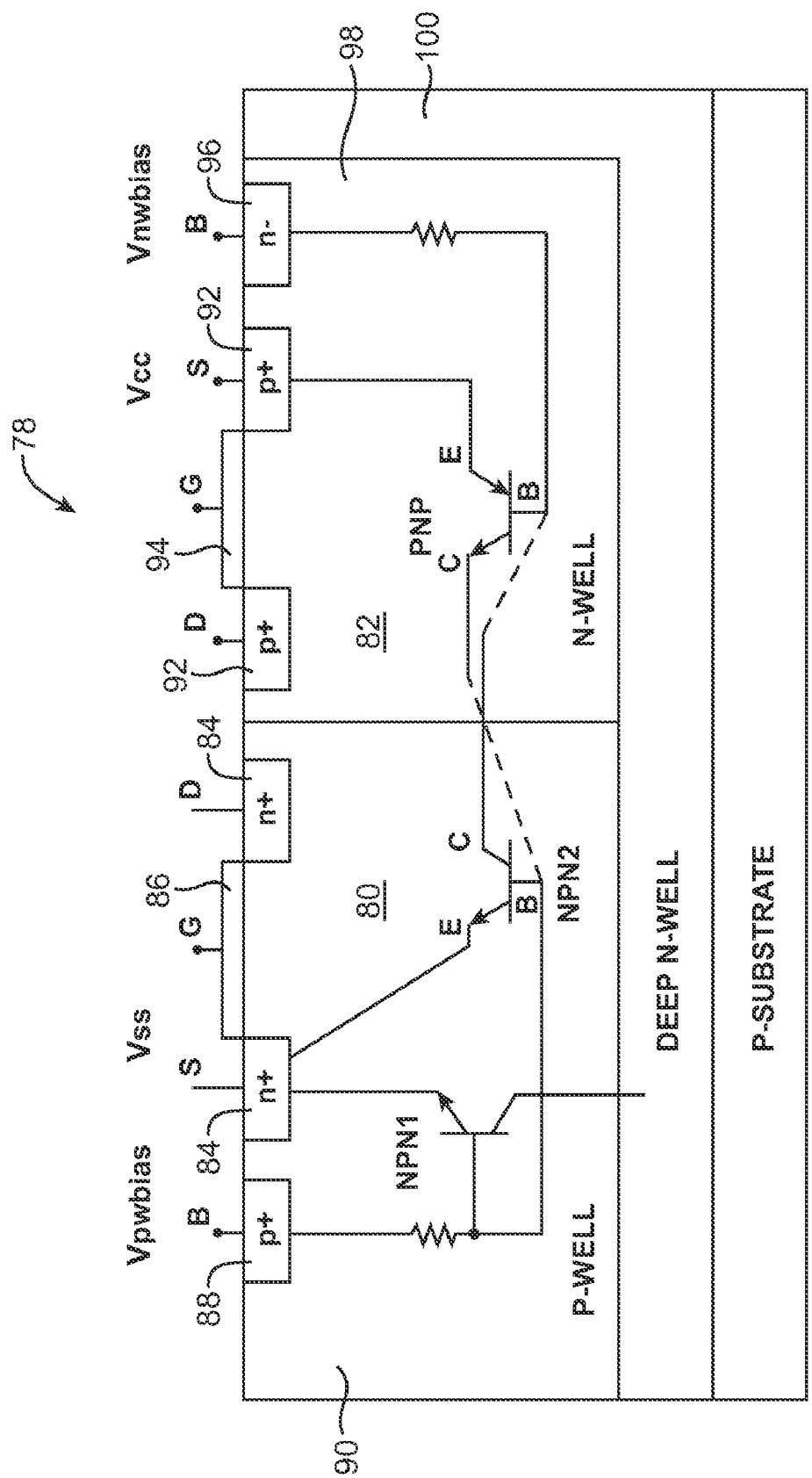
FIG. 5 is cross-sectional side view of an illustrative complementary metal-oxide-semiconductor transistor structure showing the locations of parasitic bipolar transistors that can lead to latch-up under certain biasing conditions.

The latch-up phenomena is due to the presence of parasitic bipolar transistors in the CMOS transistors structures on integrated circuit 10. A cross-section of a typical CMOS transistor structure 78 on integrated circuit 10 is shown in FIG. 5. CMOS structure 78 has an NMOS transistor 80 and a PMOS transistor 82.

In transistor 80, source S and drain D are formed using implant regions 84. Gate structure 86 is formed from a thin layer of insulator such as silicon oxide and a gate conductor such as silicided polysilicon. Body terminal B uses implant region 88 to form an ohmic contact with p-type body region 90.

In transistor 82, source S and drain D are formed using implant regions 92. Gate structure 94 is formed from a thin layer of insulator such as silicon oxide and a gate conductor such as silicided polysilicon. Body terminal B uses implant region 96 to form an ohmic contact with n-type body region 98. Deep n-type well 100 surrounds well 90 and well 98.

When transistor 80 is operating normally, a negative body bias Vpwbias is applied to the body terminal B of transistor 80 to increase its effective threshold voltage and thereby reduce power consumption. When transistor 82 is operating normally, a positive body bias Vnwbias is applied to the body terminal B of transistor 82 to increase its threshold voltage and thereby reduce power consumption. The voltages applied to the source, drain, and gate terminals of transistors 80 and 82 depend on the circuit in which they are operating. In typical circuit configurations (e.g., certain inverters), the source S of transistor 80 is at Vss and the source S of transistor 82 is at Vcc. Sources and drains in PMOS and NMOS transistors are generally interchangeable and are sometimes referred to collectively as source-drains or source-drain terminals.

As shown in FIG. 5, the doped semiconductor regions in CMOS structure 78 form parasitic bipolar transistors NPN1, NPN2, and PNP. The heavily doped p+ regions 92 form the emitter of the parasitic bipolar transistor PNP. The heavily doped n+ regions 84 form the emitters of the parasitic bipolar transistors NPN1 and NPN2. Under certain power-up sequences, feedback between the parasitic bipolar transistors NPN1/NPN2 and PNP can cause the CMOS structure 78 to enter an undesirable latch-up state.

In general, if the ground signal Vss is not present, the integrated circuit 10 is not operable. Both latch-up and normal operation require Vss to be present. If Vss is present, there are two possible scenarios—Vcc is applied to the circuitry of the integrated circuit before the body bias voltages Vpwbias and Vnwbias become valid or Vcc is applied to the circuitry of the integrated circuit after the body bias voltages become valid. If the body bias voltages Vpwbias and Vnwbias become valid after Vss and Vcc become valid, conditions suitable for latch-up are present and latch-up may result.

Consider the operation of CMOS transistor structures 78 of FIG. 5 when the body bias voltages Vpwbias and Vnwbias become valid after Vcc and Vss have already become valid. Before the body bias signals are valid, the body terminals B of transistors 80 and 82 are floating (e.g., terminals B are capacitively coupled to ground). The 1.1 volt signal Vcc on the source of transistor 82 tends to forward bias the emitter-base junction of the parasitic bipolar transistor PNP. With the emitter-base junction of transistor PNP forward biased, the base of transistor PNP is one diode turn-on voltage (0.6 volts) lower in voltage than the emitter. Because Vcc is 1.1 volts in this example, the voltage on the base of the parasitic PNP transistor is about 0.5 volts (i.e., 1.1 V-0.6 V). With the emitter-base junction of the parasitic PNP transistor forward biased, the parasitic PNP transistor turns on, which causes the collector of the parasitic PNP transistor to pull the bases of parasitic bipolar transistors NPN1 and NPN2 towards Vcc. As the voltage on the bases of transistors NPN1 and NPN2 rises, the base-emitter junctions of parasitic bipolar transistors NPN1 and NPN2 become forward biased and turn on parasitic bipolar transistor NPN2. With transistors NPN1 and NPN2 on, the base of the PNP transistor is pulled toward Vss, which further turns on the parasitic PNP transistor. Through this feedback mechanism, the parasitic transistors become latched in a state in which an undesirable and potentially damaging large current flows from Vcc to Vss through the parasitic bipolar transistor PNP and the parasitic bipolar transistors NPN1 and NPN2. This undesirable latch-up condition will persist, even if valid values of Vnwbias and Vpwbias are subsequently applied to the body terminals of transistors 80 and 82.

In accordance with the present invention, body bias circuitry is provided with latch-up prevention circuitry that detects potentially dangerous power supply conditions and takes actions to prevent latch-up from occurring. The latch-up prevention circuitry can detect when the power supply voltages Vss and Vcc become valid before the body biases Vpwbias and Vnwbias and, when this situation is detected, can clamp the body bias distribution paths at safe voltages. For example, Vpwbias can be clamped at Vss and Vnwbias can be clamped at Vcc until the Vpwbias and Vnwbias signals are valid (e.g., because the necessary precursor power supply voltages for these bias signals have been satisfactorily received and are able to generate valid bias signals on chip). By momentarily clamping Vpwbias and Vnwbias until the integrated circuit has been fully powered up, latch-up scenarios are avoided. The latch-up prevention circuitry ensures that the integrated circuit is hot socket compatible and makes it unnecessary to place power-up restrictions on the user.

Figure 6:
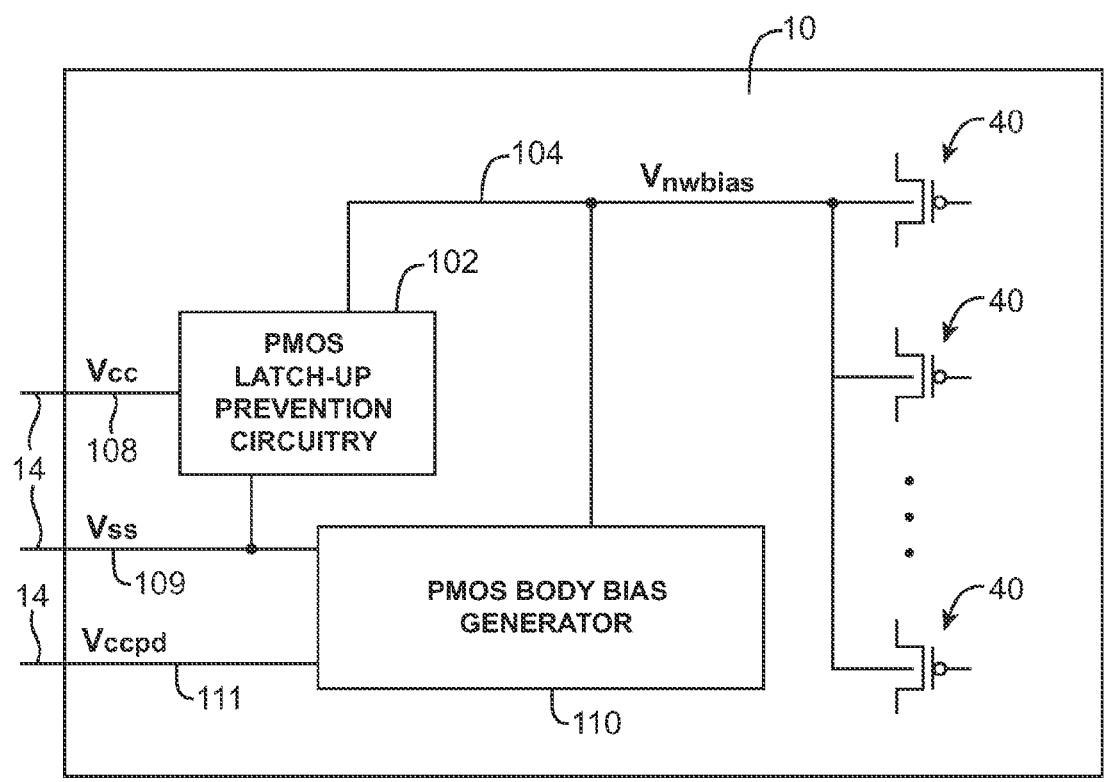
FIG. 6 is a circuit diagram of illustrative circuitry that may be used in preventing latch-up in body-biased p-channel metal-oxide-semiconductor transistors in accordance with the present invention.

An illustrative programmable logic device integrated circuit 10 with adjustable PMOS body biasing and PMOS latch-up prevention circuitry is shown in FIG. 6. PMOS latch-up prevention circuitry 102 receives positive power supply Vcc and ground power supply Vss from external pins 14 via paths 108 and 109. Body bias generator 110 receives elevated positive power supply Vccpd and ground power supply Vss from external pins 14 via paths 111 and 109. During normal operation of integrated circuit 10, body bias lines such as Vnwbias line 104 are used to distribute the body bias signal Vnwbias to PMOS transistors 40. Any suitable number of body bias signals may be used on circuit 10. Use of a single body bias signal is shown in FIG. 6 as an example.

The PMOS latch-up prevention circuit 102 monitors the signals Vcc and Vss and monitors the signal Vnwbias to determine if a potential latch-up condition exists. When the integrated circuit 10 is powered up (e.g., when a user inserts a device in which integrated circuit 10 is contained into a socket), power supply signals such as Vcc, Vss, and Vccpd can be applied to lines 108, 109, and 111 in various orders. If PMOS latch-up prevention circuitry 102 determines that the signals Vcc and Vss have become valid before the signal Vnwbias is valid, the PMOS latch-up prevention circuitry 102 can hold the voltage on line 104 at a safe voltage such as Vcc. This prevents the emitter-base junctions of the parasitic PNP transistors in the PMOS transistors 40 from becoming forward biased and prevents latch-up. Once the signal Vnwbias becomes valid, the PMOS latch-up prevention circuitry 102 can release line 104. This allows the Vnwbias signal to be used for normal body biasing of transistors 40. PMOS body bias generator 110 includes control circuitry that prevents PMOS body bias generator 110 from adversely affecting the performance of PMOS latch-up prevention circuitry 102.

The signals Vcc, Vss, and Vnwbias can be directly monitored by PMOS latch-up prevention circuitry 102 as shown in FIG. 6 or latch-up prevention circuitry 102 can monitor voltages that are associated with signals Vcc, Vss, and Vnwbias. For example, if a power supply signal is derived from Vcc or if Vcc is derived from another power supply signal, the latch-up prevention circuitry 102 can monitor those signals instead of measuring Vcc directly. Similarly, if Vnwbias is derived from another power supply voltage or is used in producing another power supply voltage, one of those power supply voltages can be monitored by latch-up prevention circuitry 102 instead of monitoring Vnwbias. Signal monitoring arrangements in which Vcc and Vnwbias are monitored directly to determine when potential latch-up conditions are present are described as an example.

Figure 7:
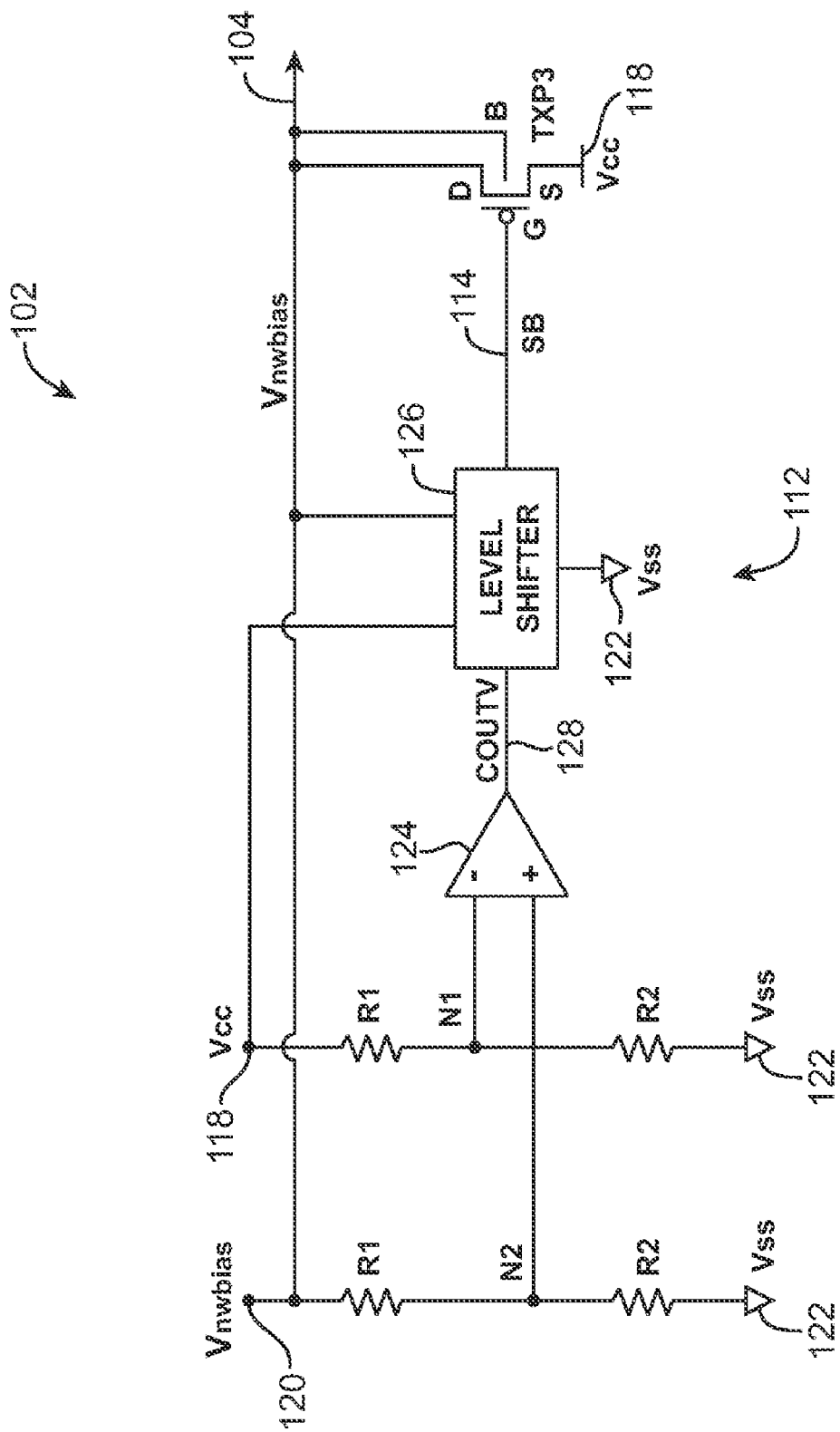
FIG. 7 is a circuit diagram of illustrative latch-up prevention circuitry of the type shown in FIG. 6 in accordance with the present invention.

Illustrative PMOS latch-up prevention circuitry 102 is shown in FIG. 7. As shown in FIG. 7, circuitry 102 includes control circuitry 112 and transistor TXP3. The PMOS body bias path 104 is used to distribute the body bias signal Vnwbias to the body terminals of PMOS transistors 40 of FIG. 4. Path 104 receives the signal Vnwbias from PMOS body bias generator 110 of FIG. 6 via terminal 120. As shown in FIG. 7, control circuitry 112 is electrically connected to path 104 and receives ground signal Vss from line 109 of FIG. 6 at terminals 122. Positive power supply signal Vcc is received from path 108 of FIG. 6 at terminals 118.

During operation, control circuitry 112 monitors the voltage on path 104 and generates a corresponding control signal SB at its output. The control signal SB is applied to the gate of transistor TXP3 using path 114. One of the drain-source terminals of transistor TXP3 is connected to a positive power supply terminal 118 and is powered with signal Vcc. The other drain-source terminal of transistor TXP3 and the body terminal of transistor TXP3 are connected to path 104.

Control circuitry 112 monitors the status of the signal Vcc. If control circuitry 112 detects that Vcc is valid while Vnwbias is not valid (i.e., when Vnwbias is capacitively coupled to ground or is at ground), control circuitry 112 generates a low value of SB at its output. The low value of SB turns on transistor TXP3 and electrically connects terminal 118 to line 104. As long as transistor TXP3 is on, the voltage on line 104 will remain clamped at Vcc. When control circuitry 112 detects that the Vnwbias signal on line 104 has become valid, control circuitry 112 generates a high value of SB at its output. The high SB signal turns off transistor TXP3 and allows the Vnwbias voltage from generator 110 of FIG. 6 to be used to body bias transistors 40.

Control circuitry 112 can be implemented using any suitable circuit architecture. With the illustrative arrangement of FIG. 7, resistors R1 and R2 form a pair of voltage dividers. The ratio of the resistances of R1 and R2 is chosen so that appropriate voltage levels are supplied to the positive and negative inputs of comparator 124. For example, values of R1 and R2 may be used that result in a voltage of 0.5 volts being produced at node N1 when Vcc is equal to 1.1 volts. When Vcc and Vss are not valid (i.e., Vcc and Vss are capacitively coupled to ground or are at ground), the voltage at node N1 is at 0 volts. The voltage divider connected to terminal 120 operates similarly. When Vnwbias is not valid, the voltage on node N2 is at 0 volts. When Vnwbias is valid, the voltage at node N2 is greater than 0.5 volts.

Comparator 124 compares the signals on its inputs and produces a corresponding output signal COUTV on its output. When Vnwbias, Vss, and Vcc are valid, the value of Vnwbias will be larger than or equal to Vcc. In this situation, the voltage on node N2 will be larger than the voltage on node N1 and the signal COUTV will be high. If Vnwbias is not valid (i.e., Vnwbias is not greater than or equal to Vcc), the voltage on node N2 will not be larger than the voltage on N1 and the signal COUTV will be low.

The signal COUTV ranges from a low of Vss to a high of Vcc. To fully turn off transistor TXP3 during normal operation when the signal Vnwbias on line 104 is valid, the COUTV signal on line 128 is level shifted using level shifter 126. The resulting level-shifted version of the signal COUTV is provided as control signal SB on line 114. When COUTV is at Vss, the signal SB is at Vss. When COUTV is at Vcc, the signal SB is at Vnwbias (e.g., 1.6-2.5 volts), which is greater than or equal to Vcc.

Figure 8:
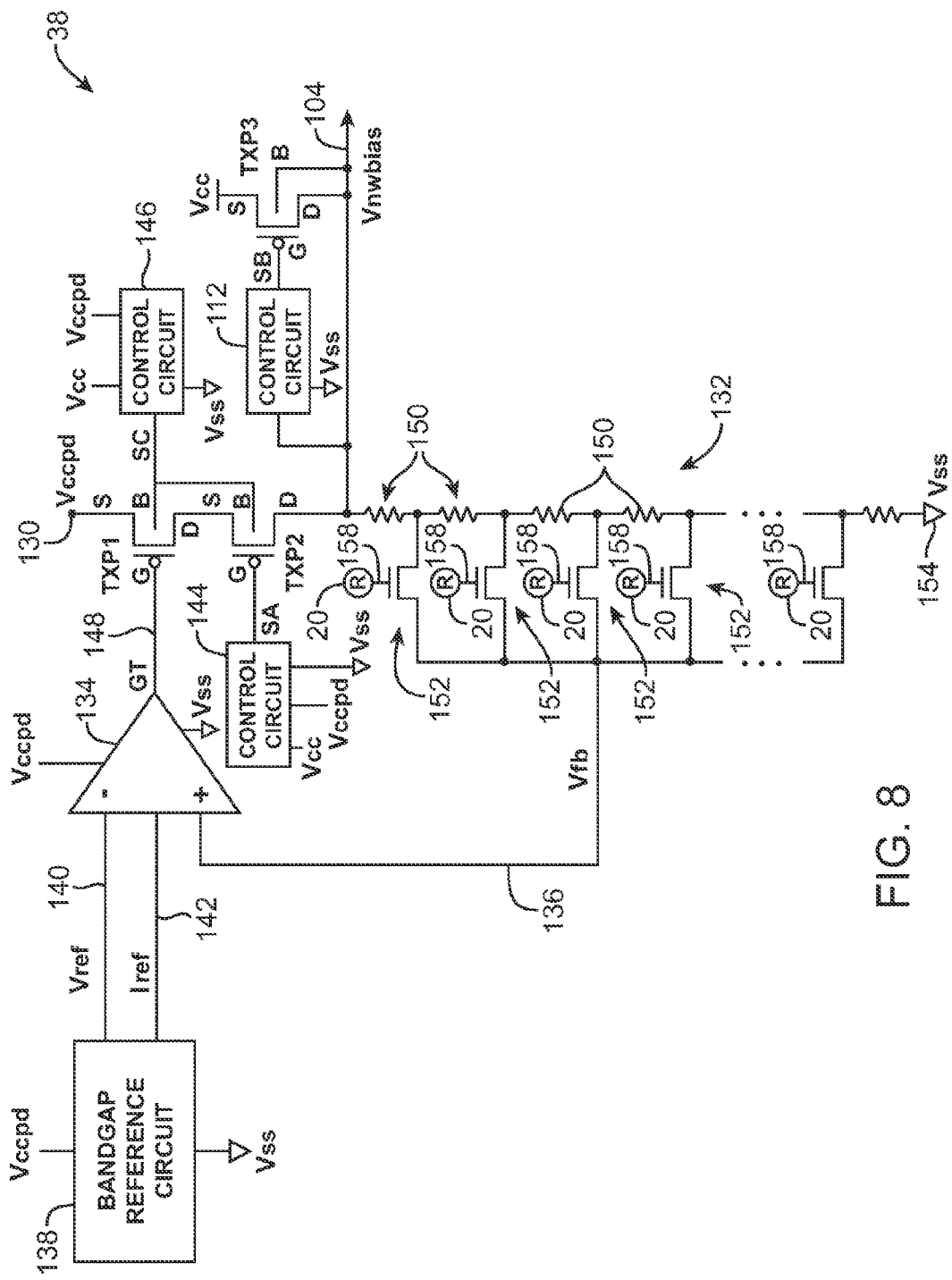
FIG. 8 is a circuit diagram of illustrative adjustable p-channel body bias generation circuitry that may include latch-up prevention circuitry of the type shown in FIG. 7 in accordance with the present invention.

Adjustable PMOS body bias generation circuitry 38 in which latch-up prevention circuitry of the type shown in FIG. 7 may be used is shown in FIG. 8. As shown in FIG. 8, PMOS body bias generation circuitry 38 includes latch-up prevention transistor TXP3, which is used to clamp the Vnwbias line 104 at Vcc when potential latch-up conditions are detected. The operation of transistor TXP3 is controlled using control circuitry such as control circuitry 112 of FIG. 7.

The adjustable PMOS body bias generation circuitry 38 of FIG. 8 is based on an adjustable voltage regulator circuit. During normal operation, the adjustable voltage regulator circuit regulates the voltage Vccpd that is applied to terminal 130 to produce a desired Vnwbias level on line 104. The setting of adjustable voltage divider 132 determines the magnitude of the feedback signal Vfb that is applied to the input of operational amplifier 134 on feedback line 136. Operational amplifier 134 produces a control signal output GT that controls the gate of control transistor TXP1 and thereby regulates the voltage level for the Vnwbias signal on line 104.

Bandgap reference circuit 138 is powered by positive power supply voltage Vccpd and ground voltage Vss. The bandgap reference circuit 138 supplies reference voltage Vref and reference current Iref on corresponding output lines 140 and 142. The particular values chosen for Vref and Iref are not critical. An example of a suitable Vref value is 0.5 volts. An example of a suitable Iref value is 10 µA.

An NMOS transistor or a PMOS transistor may be used for control transistor TXP1. If TXP1 is an NMOS transistor, the highest voltage level Vnwbias that can be supplied at line 104 will be Vccpd-Vtn, where Vtn is the NMOS transistor's threshold voltage. An advantage of using a PMOS transistor for TXP1, as shown in FIG. 8, is that this allows the Vnwbias voltage to be adjusted over the full range from Vcc to Vccpd (rail-to-rail).

The PMOS transistor TXP2 serves as an isolation transistor and is preferably connected in series with transistor TXP1 between Vccpd power supply terminal 130 and Vnwbias line 104. Transistor TXP2 is controlled by control circuitry 144. The control circuitry 144 monitors the power supply lines Vccpd, Vcc, and Vss to determine whether potential latch-up conditions are present.

During normal operation, when Vcc and Vccpd are both valid, there is no potential for latch-up and control circuitry 144 generates a low value of control signal SA. The low value of SA turns on transistor TXP2 and allows the adjustable voltage regulator to function normally.

When Vss and Vcc are valid but Vccpd is not valid (i.e., because terminal 130 is capacitively coupled to ground or is at ground), a potential latch-up situation is detected by circuitry 144 and signal SA is taken high. This turns off transistor TXP2 and isolates line 104 from the Vccpd terminal 130. Because line 104 is isolated from terminal 130, the voltage Vnwbias on line 104 is not pulled to ground through transistor TXP1 to the low (ground) value of the invalid Vccpd signal.

The body terminals B of transistors TXP1 and TXP2 are biased using a body bias signal SC that is generated by control circuitry 146. Control circuitry 146 monitors the power supply signals Vccpd, Vcc, and Vss to detect potential latch-up conditions. When signals Vcc and Vccpd are valid, control circuitry 146 holds SC at Vccpd. In this situation the body terminals B of transistors TXP1 and TXP2 are at a voltage level that is greater than or equal to their respective source voltages, thereby allowing transistors TXP1 and TXP2 to operate normally. When a potential latch-up situation is detected (i.e., because Vccpd terminal 130 is capacitively coupled to ground or is at ground while Vcc is valid), the power supply voltage Vccpd is unavailable to apply to transistors TXP1 and TXP2. Accordingly, control circuitry 146 takes signal SC to the next highest positive power supply voltage that is available—Vcc—to prevent the source-bulk p-n junctions in transistors TXP1 and TXP2 from becoming forward biased. This scheme prevents damage to transistors TXP1 and TXP2, so that transistors TXP1 and TXP2 can operate normally when the Vccpd signal becomes valid.

During normal operation, the voltage Vfb is fed back to operational amplifier 134 from the voltage divider 132 via feedback path 136. The voltage Vfb is proportional to the setting of adjustable voltage divider 132 and the magnitude of Vnwbias. The reference voltage Vref is supplied to operational amplifier 134 via path 140.

Operational amplifier 134 compares the signals on lines 136 and 140 and generates a corresponding output GT on path 148. When the signal Vfb on line 136 is greater than the signal on line 140, the output of operational amplifier 134 goes high. This tends to turn transistor TXP1 off and causes the voltage Vnwbias on line 104 to drop towards a set point value established by the setting of voltage divider 132. When the signal on line 136 is less than the signal on line 140, the output of operational amplifier 134 on line 148 is lowered. This tends to turn on transistor TXP1, which causes voltage Vnwbias on line 104 to rise towards Vccpd. Using this feedback arrangement, the value of Vnwbias is held constant at its desired set point value (i.e., a desired voltage between Vcc and Vccpd determined by the setting of voltage divider 132).

Adjustable voltage divider 132 is formed from a number of series-connected resistors 150. Typical resistor values are about 10 kΩ to 50 kΩ. One end of the resistor chain in voltage divider 132 is maintained at a voltage Vss. The other end of the resistor chain connected to Vnwbias path 104.

The voltage Vfb is tapped off of the resistor chain in the voltage divider 132 using feedback path 136. By adjusting the point at which the voltage Vfb is tapped from the series-connected resistors in voltage divider 132, the voltage setpoint for the voltage divider can be adjusted. In the illustrative arrangement of FIG. 8, the voltage tap point location in the series-connected resistors of the voltage divider is established by setting the states of programmable elements 20. Each programmable element 20 controls a corresponding transistor 152. The state of each programmable element is determined by its contents. During device programming, configuration data is loaded into programmable elements 20. Programmable elements that are loaded with logic zeros produce low output signals and turn off their associated transistors 152. One of the programmable elements is loaded with a logic one. The logic one in the programmable element causes the output of that programmable element to go high. The high output signal turns on a corresponding transistor 152. The location at which the transistor 152 is turned on in the chain of resistors 150 determines the set point for the voltage divider 132.

The voltage Vfb from the voltage divider 132 is fed back to the operational amplifier 134 via feedback path 136. Operational amplifier 134 is powered using a suitable power supply voltages (e.g., voltage Vccpd and voltage Vss in the example of FIG. 8). The operational amplifier 132 compares the voltage Vfb that is tapped from the voltage divider 132 to the reference voltage Vref and produces the corresponding output control signal GT. The signal GT is applied to the gate G of transistor TXP1. Transistor TXP1 is normally on and operates in saturation. Current flows from Vccpd node 130 to Vss node 154 through the resistors of the voltage divider 132 and the sources and drains of transistors TXP1 and TXP2.

The feedback loop from the voltage divider 132 through the operational amplifier 134 accurately maintains the voltage Vnwbias at its desired level. If Vnwbias begins to rise slightly above its set point, Vfb will rise slightly. The feedback provided by path 136 will then cause the output GT of operational amplifier 134 to increase. In response to the increased value of GT, the current through transistor TXP1 and will decrease. Decreasing the current through transistor TXP1 will cause Vnwbias to fall back towards its desired set point value. If Vnwbias begins to fall slightly below its set point, feedback through path 136 will cause Vnwbias to rise.

The number of resistors 150 that are used in voltage divider 132 is determined by the number of voltage steps desired for the adjustable body bias generation circuitry 38. If many resistors 150 are used, there will be a relatively large number of voltage steps and body bias generation circuitry 38 will be able to produce desired Vnwbias levels with a high level of precision. If fewer resistors 150 are used, each voltage step will be larger and less precision will be available, but circuit complexity will be reduced. In general, any suitable number of resistors 150 and associated tap transistors 152 may be used in voltage divider 132.

In the example of FIG. 8, the control signals that are applied to the gates of transistors 152 over control signal lines 158 in adjustable voltage divider 132 are supplied by programmable elements 20. If desired, the control signals for transistors 152 may be dynamic control signals that are supplied from the outputs of programmable logic 18 or hardwired logic on device 10. External control signals may also be used to control transistors 152.

Figure 9:
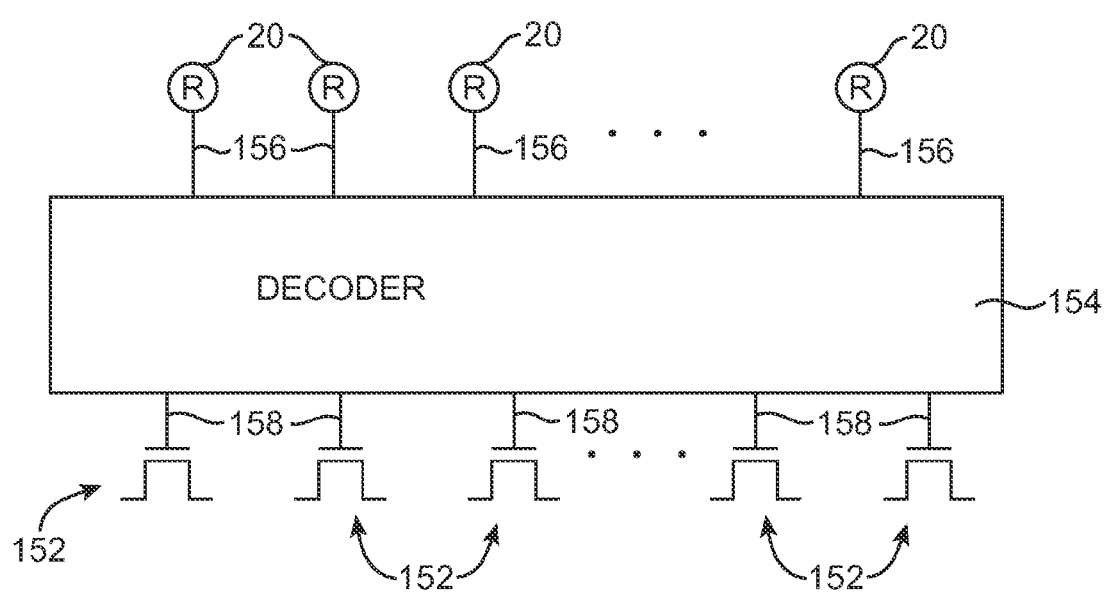
FIG. 9 is a diagram showing how the transistors in the programmable voltage divider of FIG. 8 may be controlled by control signals that are decoded by a decoder in accordance with the present invention.

If desired, a decoder 154 may be used to supply control signals to transistors 152, as shown in FIG. 9. In the illustrative arrangement shown in FIG. 9, programmable elements 20 are used to provide static control signals to decoder 154 on input lines 156. The control signals applied to decoder 154 may also be dynamic control signals that are supplied to lines 156 from the outputs of programmable logic 18 or hardwired logic on device 10. External control signals may also be routed to lines 156 from pins 14. Decoder 154 contains logic that converts the undecoded control signals on input lines 156 into corresponding decoded control signals on control lines 158. The lines 158 are used to route these control signals to the gates of respective transistors 152.

The use of a decoder such as the decoder 154 of FIG. 9 increases the complexity of the device 10. Moreover, circuit real estate is required for the logic of decoder 154 and the lines 156 and 158. Nevertheless, the use of a decoder such as decoder 154 reduces the need for programmable elements 20. For example, it is possible to control $2^N$ lines 158 using N programmable elements. In situations in which there are relatively large numbers of transistors 152, it may be more efficient to use a decoder 154 than to use a separate programmable element 20 to control each transistor 152.

Figure 10:
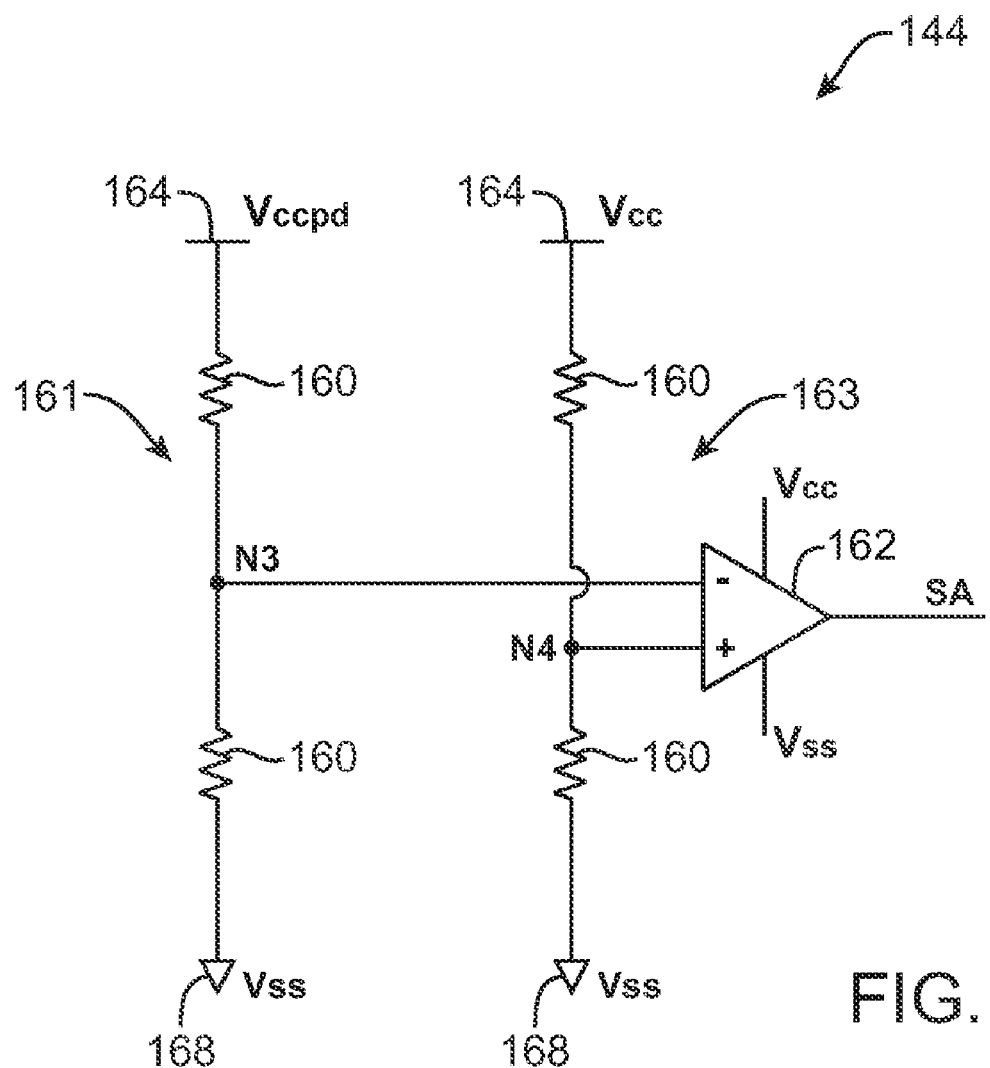
FIG. 10 is a circuit diagram of illustrative control circuitry that may produce a transistor gate control signal for use in controlling the operation of an isolation transistor in the body bias generation circuitry of FIG. 8 in accordance with the present invention.

Illustrative circuitry that may be used for control circuitry 144 of FIG. 8 is shown in FIG. 10. As shown in FIG. 10, control circuitry 144 receives elevated power supply signal Vccpd on terminal 164, positive power supply signal Vcc on terminal 166, and ground power supply signal Vss on terminals 168. A pair of voltage dividers 161 and 163 are formed using resistors 160. The resistances of resistors 160 are selected so that the voltages at nodes N3 and N4 can be compared to determine the states of Vccpd, Vcc, and Vss. When all power supply signals are valid, the voltage at node N3 is greater than the voltage at node N4. When Vcc and Vss are valid while Vccpd is not valid, the voltage at node N3 is at 0 V, which is less than the voltage at node N4. Comparator 162, which is powered using positive power supply voltage Vcc and ground power supply voltage Vss, compares the voltages on nodes N3 and N4 and produces a corresponding output signal SA. During normal operation, signals Vcc, Vccpd, and Vss are valid, the voltage on node N3 is greater than the voltage on node N4, and the output SA is low at Vss. During potential latch-up conditions, when voltage Vccpd is not valid while Vcc and Vss are valid, the voltage on node N3 is less than or equal to the voltage on node N4 and the output SA is high at Vcc.

Figure 11:
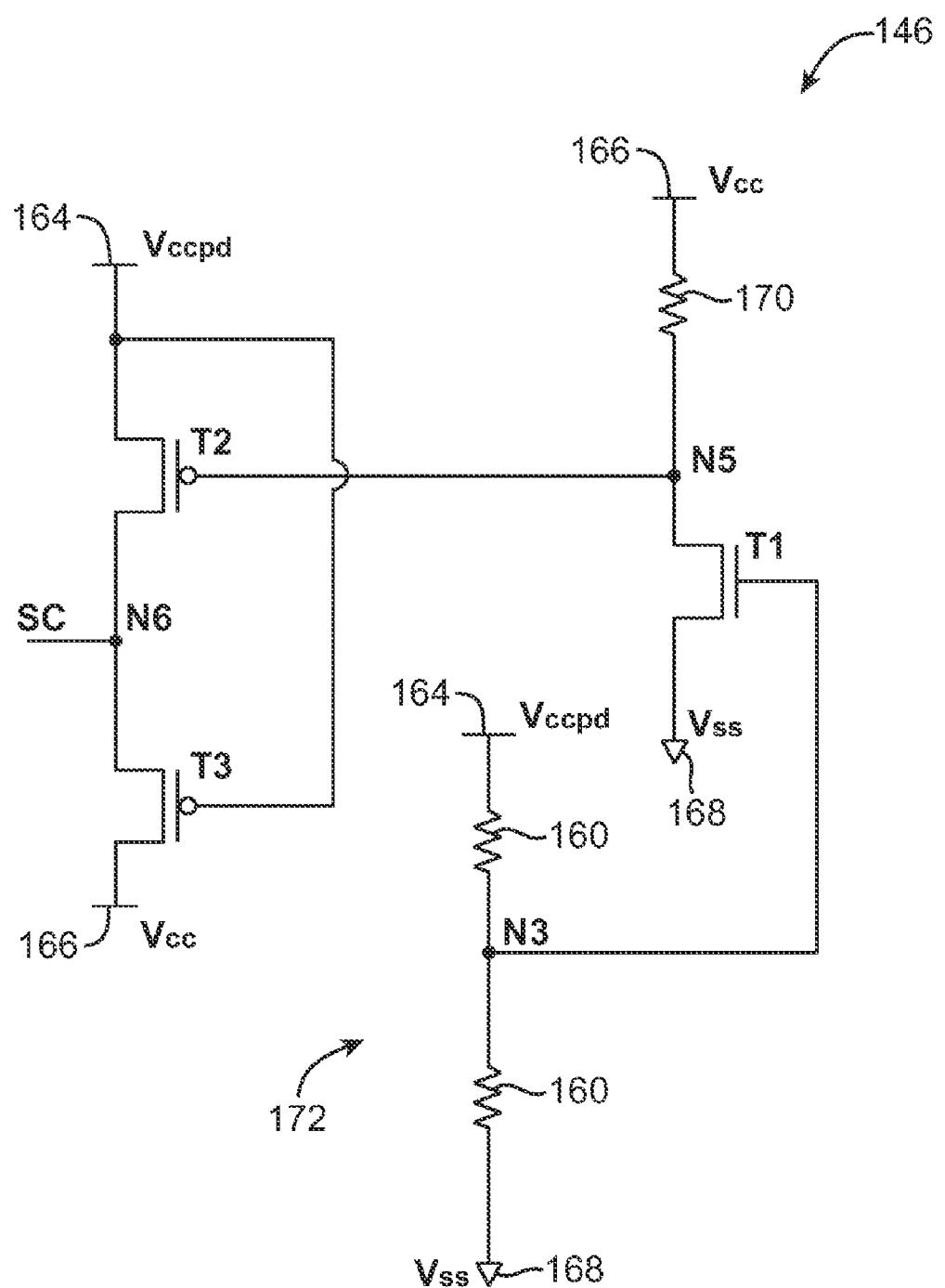
FIG. 11 is a circuit diagram of illustrative control circuitry that may produce a variable transistor body bias signal for use in body biasing a control transistor and an isolation transistor in the circuitry of FIG. 8 in accordance with the present invention.

Illustrative circuitry that may be used for control circuitry 146 of FIG. 8 is shown in FIG. 11. Control circuitry 146 receives voltage Vccpd on terminals 164, voltage Vcc on terminals 166, and voltage Vss on terminals 168. Voltage divider 172 contains a pair of resistors 160 connected between Vccpd and Vss. The voltage divider 172 may be formed from the same components used to form voltage divider 161 of FIG. 10. The voltage on node N3 is applied to the gate of transistor T1. Transistor T1 and resistor 170 are connected between Vcc and Vss. The voltage on node N5 controls the gate of transistor T2. The voltage Vccpd from terminal 164 is applied to the gate of transistor T3. The output signal SC is provided at node N6.

When the power supply signal Vccpd that is applied to circuitry 146 is not valid and Vcc and Vss are valid, the voltage of node N3 is 0 volts. The low voltage at node N3 turns NMOS transistor T1 off, which causes the voltage on node N5 to rise to Vcc. With the voltage on node N5 at Vcc, transistor T2 is off. The signal Vccpd is capacitively coupled to ground or is at ground, so that transistor T3 is on. With transistor T2 off and transistor T3 on, the voltage on node N6 and therefore the output voltage SC is taken to Vcc.

When circuitry 146 receives a valid Vccpd signal while Vcc and Vss are valid, the voltage on node N3 is greater than the threshold voltage Vt of transistor T1. Transistor T1 is therefore turned on. With transistor T1 turned on, the voltage on node N5 goes low to Vss. This turns on transistor T2. The gate of transistor T3 is at Vccpd (which is valid), so transistor T3 is off. With transistor T2 on and transistor T3 off, the signal SC is taken to Vccpd.

Figure 12:
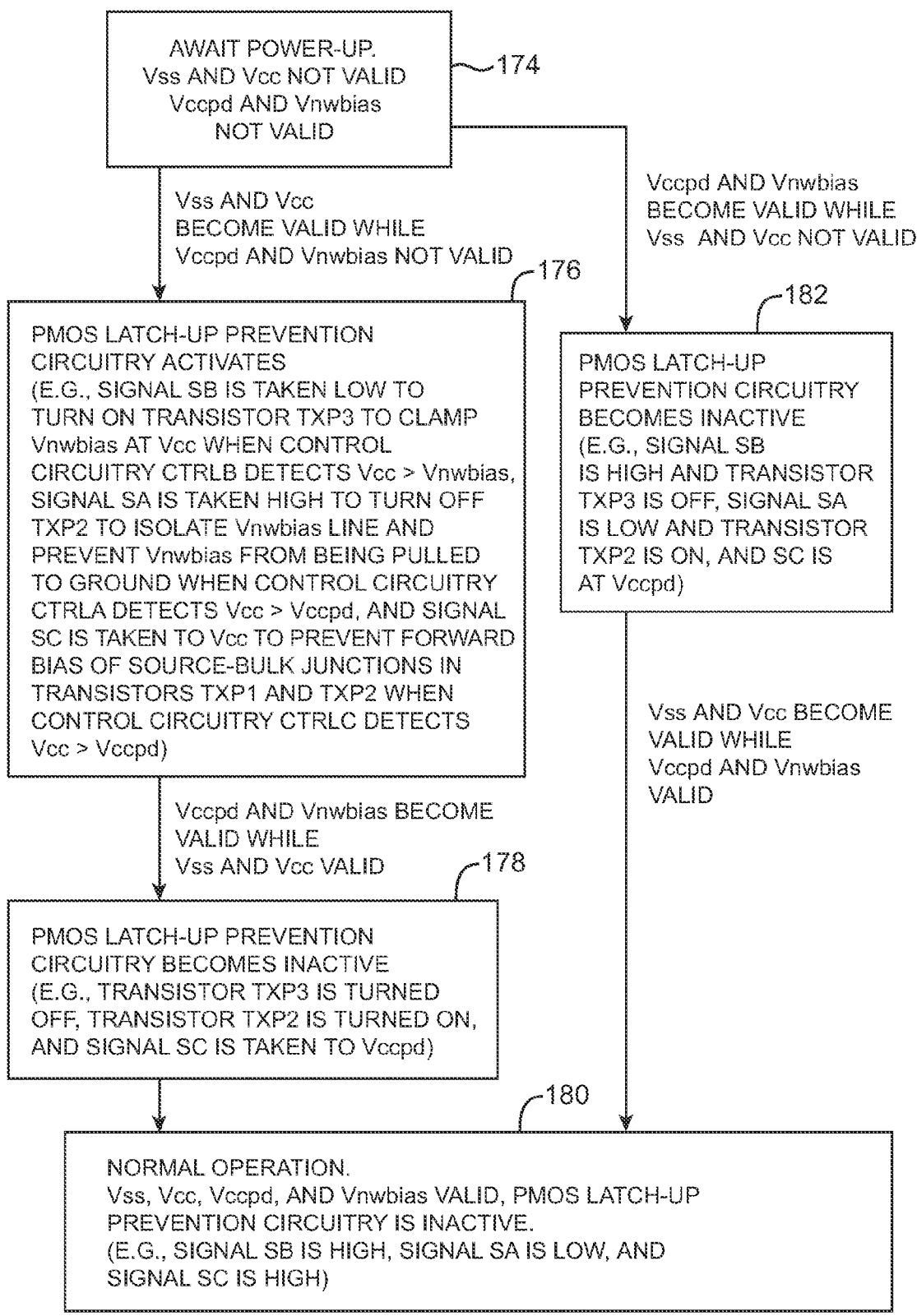
FIG. 12 is a diagram illustrating operations involved in using the adjustable p-channel metal-oxide-semiconductor transistor body biasing circuitry of FIG. 8 on an integrated circuit such as a programmable logic device integrated circuit in accordance with the present invention.

Operations involved in using PMOS body bias generation circuitry 38 that includes PMOS latch-up prevention circuitry are shown in the flow chart of FIG. 12. Initially, before the proper power supply voltages have been established at the pins of the integrated circuit 10, the signals Vcc, Vss, Vnwbias, and Vccpd are capacitively coupled to ground or are coupled to power supply lines that are at ground (i.e., power supply lines on a system board that have not yet been powered). When power supply signals are in this state, they are said to not be valid. This initial pre-power-up state in which the circuitry of FIG. 8 awaits power is represented by step 174 in FIG. 12.

The way in which the PMOS body bias generation circuitry 38 operates depends on the order in which the signals Vcc, Vss, Vccpd, and Vnwbias are powered.

If Vss and Vcc become valid while Vnwbias and Vccpd are not valid, the PMOS latch-up prevention circuitry will activate to prevent latch-up (step 176 of FIG. 12). During the operations of step 176, the PMOS latch-up prevention circuitry 102 will use circuitry 112 to detect the potential latch-up condition and will generate a low SB control signal to turn transistor TXP3 on, as described in connection with FIG. 7.

Turning transistor TXP3 on creates a low resistance path between terminal 118 and line 104 (FIG. 7), so the signal on the Vnwbias lines in the integrated circuit are clamped at Vcc.

Holding Vnwbias at a safe voltage such as Vcc prevents Vnwbias from dropping to low voltages, which could forward bias the emitter-base junction in the parasitic PNP transistor (FIG. 5). By preventing the emitter-base junction of the PNP transistor from becoming forward biased, latch-up is prevented. During the operations of step 176, the control circuitry 144 detects the potential latch-up condition and generates a high signal SA to turn off transistor TXP2, as described in connection with FIG. 10. Turning off transistor TXP2 during latch-up conditions prevents the voltage Vcc on line 104 from being pulled towards the ground voltage at terminal 130 and thereby helps the latch-up prevention functions of circuitry 38 to function properly. At the same time, control circuitry 146 detects the potential latch-up conditions and takes the SC control signal to Vcc to prevent the source-body junction of transistors TXP1 and TXP2 from becoming forward biased, as described in connection with FIG. 11.

When the Vccpd and Vnwbias signals become valid while Vss and Vcc are valid, latch-up conditions are no longer present. As a result, the PMOS latch-up prevention circuitry becomes inactive, as shown by step 178 in FIG. 12. In particular, when Vccpd becomes valid, control circuits 144 and 146 adjust their outputs so that the PMOS body bias generation circuitry can generate a valid Vnwbias signal for line 104. Control circuitry 112 detects the valid Vnwbias signal and releases the Vcc clamping voltage from line 104. Under these conditions, the transistor TXP3 is turned off and the voltage on line 104 (FIG. 8) is maintained at a desired value of Vnwbias.

During step 178, when the latch-up conditions are no longer present, the control circuitry 144 detects that the voltage on node N3 is greater than the voltage on node N2, as described in connection with FIG. 10. Comparator 162 therefore generates a low (Vss) signal SA on its output to turn transistor TXP2 on. With transistor TXP2 on, transistor TXP1 is switched into use and is regulated using the signal GT from operational amplifier 134 in response to the feedback signal Vfb tapped from voltage divider 132. At the same time, the high voltage on node N3 turns on transistor T1 and causes the control signals SC to rise to Vccpd, as described in connection with FIG. 11. The SC signal serves to body bias transistors TXP1 and TXP2 with a sufficiently large body bias voltage to avoid undesirable forward biasing of their source-body p-n junctions. Transistors TXP1 and TXP2 can therefore operate normally.

Normal operation, in which all power supply signals are valid, is represented by step 180 in FIG. 12. In this mode, signal SB is high, so the latch-up prevention transistor TXP3 is off. This allows the Vnwbias voltage on line 104 to be adjusted using the set point determined by the state of adjustable voltage divider 132 of FIG. 8. Signal SA is low to turn isolation transistor TXP2 on, so that line 104 is not isolated from Vccpd terminal 130. A normal body bias signal SC is applied to transistors TXP1 and TXP2 so that they function properly. Transistor TXP1 operates as a voltage-controlled current source and is used in the feedback arrangement of body bias generation circuitry 38 to regulate the Vnwbias signal on line 104.

If, following the initial state of step 174, the signals Vccpd and Vnwbias becomes valid before Vss and Vcc are valid, no latch-up conditions are detected and the PMOS latch-up prevention circuitry 102 remains inactive, as shown by step 182 of FIG. 12. Because the value of Vnwbias is never less than Vcc in this situation, the control signal SB is never taken low and the latch-up prevention transistor TXP3 remains off. Control circuitry 144 detects that no latch-up condition is present and produces a low output signal SA (Vss), to turn isolation transistor TXP2 on. Control circuitry 146 detects that no latch-up condition is present and produces an SC signal at Vccpd to body bias transistors TXP1 and TXP2 properly for normal operation. After Vss and Vcc become valid, the integrated circuit 10 operates normally at step 180.

As this example demonstrates, under some conditions, such as those represented by the right-hand branch of FIG. 12, the PMOS latch-up prevention circuitry is never activated (TXP3 is never turned on). There is never a need to clamp Vnwbias at a safe voltage, because the voltages Vccpd and Vnwbias becomes valid before Vcc and Vss. Under other conditions, however, such as those represented by the left-hand branch of FIG. 12, a potential latch-up scenario is detected so that the PMOS latch-up prevention circuitry activates and TXP3 is turned on. Transistor TXP3 remains on and line Vnwbias is held at Vcc until all signals are valid and the risk of latch-up has passed.

The foregoing is merely illustrative of the principles of this invention and various modifications can be made by those skilled in the art without departing from the scope and spirit of the invention.

What is claimed is:

1. A method of preventing latch-up in an integrated circuit having metal-oxide-semiconductor transistors each of which receives a body bias signal over a body bias path, having body bias generation circuitry that supplies the body bias signal to the body bias path, having a control transistor coupled between an elevated power supply signal and the body bias path, and having latch-up prevention circuitry, the method comprising:

determining when a power supply signal is valid and the elevated power supply signal and the body bias signal are invalid; and when it is determined that the power supply signal is valid and the elevated power supply signal and the body bias signal are invalid, activating the latch-up prevention circuitry connected to the body bias path to prevent the metal-oxide-semiconductors from latching up.

2. The method defined in claim 1 further comprising:

determining when the elevated power supply signal and the body bias signal become valid while the power supply signal is valid; and when it is determined that the elevated power supply signal and the body bias signal have become valid while the power supply signal is valid, deactivating the latch-up prevention circuitry connected to the body bias path.

3. The method defined in claim 2 wherein the latch-up prevention circuitry comprises a transistor connected to the body bias path and wherein deactivating the latch-up prevention circuitry comprises turning off the transistor that is connected to the body bias path.

4. The method defined in claim 1 wherein activating the latch-up prevention circuitry comprises applying the power supply signal to the body bias path.

5. The method defined in claim 1 wherein activating the latch-up prevention circuitry comprises applying the power supply signal to a body bias terminal of the control transistor.

6. The method defined in claim 1 wherein activating the latch-up prevention circuitry comprises:

applying the power supply signal to the body bias path; and applying the power supply signal to a body bias terminal of the control transistor.

7. A method of preventing latch-up in an integrated circuit that is powered using a positive power supply signal transmitted over a positive power supply path and an elevated power supply signal transmitted over an elevated power supply path, that has metal-oxide-semiconductor transistors each of which receives a body bias signal transmitted over a body bias path, and that has a control transistor and an isolation transistor coupled in series between the elevated power supply path and the body bias path, the method comprising:
  determining when the positive power supply signal is valid and the elevated power supply signal and the body bias signal are invalid; and
  when it is determined that the positive power supply signal is valid and the elevated power supply signal and the body bias signal are invalid, turning off the isolation transistor so that the elevated power supply path and the body bias path are isolated.

8. The method defined in claim 7 wherein disabling the isolation transistor comprises applying the positive power supply signal to a gate terminal of the isolation transistor.

9. The method defined in claim 7 further comprising:
  when it is determined that the positive power supply signal is valid and the elevated power supply signal and the body bias signal are invalid, applying the positive power supply signal to the body bias path.

10. The method defined in claim 7 further comprising:
  when it is determined that the positive power supply signal is valid and the elevated power supply signal and the body bias signal are invalid, applying the positive power supply signal to body bias terminals of the control transistor and the isolation transistor.

11. The method defined in claim 7 further comprising:
  when it is determined that the positive power supply signal is valid and the elevated power supply signal and the body bias signal are invalid, applying the positive power supply signal to the body bias path and applying the positive power supply signal to body bias terminals of the control transistor and the isolation transistor.

12. The method defined in claim 7 wherein turning off the isolation transistor comprises applying the positive power supply signal to a gate terminal of the isolation transistor, the method further comprising:
  when it is determined that the positive power supply signal is valid and the elevated power supply signal and the body bias signal are invalid, applying the positive power supply signal to the body bias path and applying the positive power supply signal to body bias terminals of the control transistor and the isolation transistor.

13. An integrated circuit comprising:
  metal-oxide-semiconductor transistors each of which has a body terminal that receives a body bias signal over a body bias path; and
  metal-oxide-semiconductor body bias generation circuitry that supplies the body bias signal to the body bias path, wherein the metal-oxide-semiconductor body bias generation circuitry includes:
    a control transistor coupled between an elevated power supply terminal and the body bias path; and
    an active latch-up prevention circuit connected to the body bias path to prevent the metal-oxide-semiconductor transistors from latching up.

14. The integrated circuit defined in claim 13 wherein the metal-oxide-semiconductor transistors comprise p-channel metal-oxide semiconductor transistors.

15. The integrated circuit defined in claim 13 wherein the control transistor comprises a p-channel metal-oxide-semiconductor control transistor.

16. The integrated circuit defined in claim 13 wherein the metal-oxide-semiconductor body bias generation circuitry further comprises:
  an isolation transistor coupled between the control transistor and the body bias path.

17. The integrated circuit defined in claim 13 wherein the control transistor has a body terminal and wherein the metal-oxide-semiconductor body bias generation circuitry further comprises control circuitry that has an output connected to the body terminal of the control transistor.

18. The integrated circuit defined in claim 13 wherein the metal-oxide-semiconductor body bias generation circuitry further comprises:
  an operational amplifier that receives an adjustable feedback signal from the body bias path and that produces a gate control signal for the control transistor in response.

19. The integrated circuit defined in claim 13 wherein the active latch-up prevention circuitry includes a latch-up prevention transistor and wherein the metal-oxide-semiconductor body bias generation circuitry further comprises control circuitry that monitors a positive power supply signal and an elevated power supply signal associated with the elevated power supply terminal and that generates a low control signal when potential latch-up conditions are present that turns on the latch-up prevention transistor to clamp the body bias path at the positive power supply signal.

20. The integrated circuit defined in claim 19 wherein the control circuitry is configured to generate a high control signal when potential latch-up conditions are not present to turn off the latch-up prevention transistor.

* * * * *